(12) United States Patent
Lee et al.

(10) Patent No.: US 12,176,021 B2
(45) Date of Patent: Dec. 24, 2024

(54) VOLATILE MEMORY DEVICE

(71) Applicant: SAMSUNG ELECTRONICS CO., LTD., Suwon-si (KR)

(72) Inventors: Jae Pil Lee, Seoul (KR); Kwang Sook Noh, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 222 days.

(21) Appl. No.: 17/875,908

(22) Filed: Jul. 28, 2022

(65) Prior Publication Data

US 2023/0143132 A1   May 11, 2023

(30) Foreign Application Priority Data

Nov. 9, 2021   (KR) .................. 10-2021-0153223
Jan. 19, 2022   (KR) .................. 10-2022-0007654

(51) Int. Cl.
| | |
|---|---|
| *G11C 11/409* | (2006.01) |
| *G11C 7/18* | (2006.01) |
| *G11C 11/408* | (2006.01) |
| *G11C 11/4091* | (2006.01) |
| *G11C 11/4094* | (2006.01) |
| *G11C 11/4096* | (2006.01) |
| *G11C 11/4097* | (2006.01) |

(52) U.S. Cl.
CPC ............ *G11C 11/4087* (2013.01); *G11C 7/18* (2013.01); *G11C 11/408* (2013.01); *G11C 11/4091* (2013.01); *G11C 11/4094* (2013.01); *G11C 11/4096* (2013.01); *G11C 11/4097* (2013.01)

(58) Field of Classification Search
CPC ............ G11C 11/4087; G11C 11/4091; G11C 11/4094; G11C 11/4096; G11C 11/408; G11C 11/4097; G11C 11/419; G11C 7/18
See application file for complete search history.

(56) References Cited

U.S. PATENT DOCUMENTS

| | | |
|---|---|---|
| 6,903,404 B2 | 6/2005 | Kim |
| 7,821,805 B2* | 10/2010 | Hirose .............. H01L 27/0207 365/51 |
| 8,482,951 B2 | 7/2013 | Yi et al. |
| 8,797,778 B2 | 8/2014 | Ohgami |
| 9,236,501 B2 | 1/2016 | Lim |
| 9,396,776 B2 | 7/2016 | Yang |

(Continued)

FOREIGN PATENT DOCUMENTS

| | | |
|---|---|---|
| KR | 20100092241 A | 8/2010 |
| KR | 20140028949 A | 3/2014 |

*Primary Examiner* — Huan Hoang
*Assistant Examiner* — Justin Bryce Heisterkamp
(74) *Attorney, Agent, or Firm* — Fish & Richardson P.C.

(57) ABSTRACT

A volatile memory device having a reduced area may include; a row decoder extending in a first direction, a column decoder extending in a second direction, a cell region between the row decoder and the column decoder and including a first sense amplifier and a first bit line connected to the first sense amplifier, and a first peripheral circuit region spaced apart from the cell region in the first direction and including includes a first complementary bit line connected to the first sense amplifier. The first sense amplifier may be configured to perform a read/write operation in relation to a first memory cell connected to the first bit line using the first complementary bit line.

19 Claims, 19 Drawing Sheets

(56) References Cited

U.S. PATENT DOCUMENTS

| | | | |
|---|---|---|---|
| 2010/0039845 A1* | 2/2010 | Vollrath | H01L 27/0207 |
| | | | 365/205 |
| 2012/0218835 A1* | 8/2012 | Yun | G11C 11/4099 |
| | | | 365/189.11 |
| 2014/0003113 A1 | 1/2014 | Seno et al. | |
| 2016/0078919 A1* | 3/2016 | Han | G11C 5/02 |
| | | | 365/207 |
| 2022/0139429 A1* | 5/2022 | Lee | G11C 7/10 |
| | | | 365/207 |
| 2022/0293612 A1* | 9/2022 | Tsubomi | H10B 12/50 |

* cited by examiner

FIG. 9
BL11  }t1
BLB11  }t2
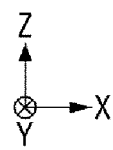

VOLATILE MEMORY DEVICE

CROSS-REFERENCE TO RELATED APPLICATIONS

This application claims priority under 35 U.S.C. 119 from Korean Patent Application No. 10-2021-0153223 filed on Nov. 9, 2021 and Korean Patent Application No. 10-2022-0007654 filed on Jan. 19, 2022, the collective subject matter of which is hereby incorporated by reference in its entirety.

BACKGROUND

Technical Field

The present disclosure relates to volatile memory devices, and more particularly, to volatile memory devices having an open bit line structure.

Description of the Related Art

Semiconductor memory devices may be generally categorized as volatile memory devices and non-volatile memory devices. Volatile memory devices (e.g., dynamic random access memory (RAM) (DRAM)) store data by charging/discharging of a constituent cell capacitor. Volatile memory devices provide relatively fast data access speeds, and are commonly used as components in computer memory systems. However, volatile memory devices lose stored data in the absence of applied power. In contrast, non-volatile memory devices are able to retain stored data in the absence of applied power. Non-volatile memory devices also provide very large data storage capacity. Accordingly, non-volatile memory devices are primarily used to implement large-capacity (or bulk) memory systems able to store program data, application data, and/or user data.

Volatile memory devices may be further categorized as having either an open bit line structure or a folded bit line structure. A sense amplifier of the volatile memory device having the corresponding structure may have corresponding bit line pairs. However, volatile memory devices having an open bit line structure may include an unnecessary mat due to particular characteristics of the open bit line structure.

SUMMARY

Aspects of the present disclosure provide volatile memory devices having a reduced area.

Aspects of the present disclosure also provide volatile memory devices capable of being more densely integrated.

Aspects of the present disclosure are not limited to those mentioned above, and additional objects of the present disclosure will be appreciated by those skilled in the art upon consideration of the following detailed description and accompanying drawings.

According to an aspect of the present disclosure, a volatile memory device may include; a row decoder extending in a first direction, a column decoder extending in a second direction, a cell region between the row decoder and the column decoder and including a first sense amplifier and a first bit line connected to the first sense amplifier, and a first peripheral circuit region spaced apart from the cell region in the first direction and including includes a first complementary bit line connected to the first sense amplifier, wherein the first sense amplifier is configured to perform a read/write operation in relation to a first memory cell connected to the first bit line using the first complementary bit line.

According to an aspect of the present disclosure, a volatile memory device may include; a row decoder extending in a first direction, a column decoder extending in a second direction, and a memory cell array between the row decoder and the column decoder. The memory cell array may include; a substrate, a first sense amplifier on the substrate, a first bit line connected to the first sense amplifier, and a first complementary bit line connected to the first sense amplifier, wherein a first height from the substrate to the first sense amplifier is greater than a third height from the substrate to the first complementary bit line, and a second height from the substrate to the first bit line is greater than the third height.

According to an aspect of the present disclosure, a volatile memory device may include; a row decoder extending in a first direction, a column decoder extending in a second direction, a memory cell array between the row decoder and the column decoder, and a dummy mat disposed separated from the memory cell array in the first direction. The memory cell array may include; a center region including a first sense amplifier, a first mat including a first bit line connected to the first sense amplifier, and a second mat including a first complementary bit line connected to the first sense amplifier, and a first edge region separated from the center region in the first direction and including a second sense amplifier and a second bit line connected to the second sense amplifier, wherein the dummy mat includes a second complementary bit line separated from the first edge region in the first direction and connected to the second sense amplifier without being disposed in the memory cell array.

BRIEF DESCRIPTION OF THE DRAWINGS

Advantages, benefits, and features, as well as the making and use of embodiments consistent with the present disclosure will become more apparent upon consideration of the following detail description together with the accompanying drawings, in which:

FIGS. 8 and 9 are diagrams illustrating a bit line and a complementary bit line according to some embodiments;

DETAILED DESCRIPTION

Hereinafter, the certain embodiments according to the present disclosure will be described with reference to the accompanying drawings.

Figure 1:
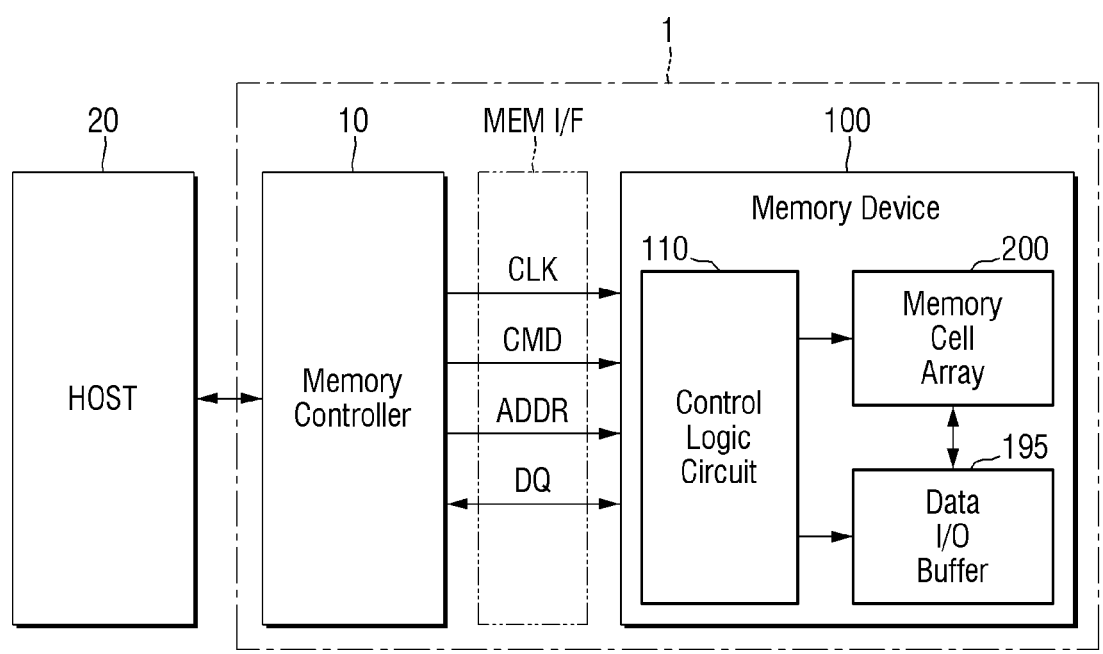
FIG. 1 is a block diagram illustrating a memory system according to some embodiments.

Figure (FIG. 1 is a block diagram illustrating a memory system according to some embodiments.

Referring to FIG. 1, the memory system may generally include a host device 20 and a memory storage device 1, wherein the memory storage device 1 may include a memory device 100 and a memory controller 10.

The memory controller 10 may control the overall operation of the memory device 100. In this regard, the memory controller 10 may control data communication (e.g., transmission and/or receipt of data) between the external host device 20 and the memory device 100. That is, the memory controller 10 may control the memory device 100 in performing various operations (e.g., a write (or program) operation, a read operation, an erases operation, etc.) responsive to one or more request(s) received from the host device 20 (e.g., a write (or program) request, a read request, or an erase request).

Within the memory storage device 1, the memory controller 10 and the memory device 100 may communication through a memory interface MEM I/F. In similar vein, the memory controller 10 may communicate with the external host device 20 through a host interface (not shown). Accordingly, the memory controller 10 may communicate a variety of external signals between the memory device 100 and the host device 20, and may further communicate a variety of internal signals (e.g., command/control signals CMD, address signals ADDR, clock signals CLK, and data signals DQ) to control operation of the memory device 100.

In some embodiments, the memory device 100 may include a DRAM, a Double Data Rate 4 DRAM (DDR4), a Synchronous DRAM (SDRAM), a Low Power DDR4 (LPDDR4) SRAM, a LPDDR5 SDRAM, etc. Alternately or additionally, the memory device 100 may include a nonvolatile memory device. Hereafter, certain embodiments will be described under an assumption that the memory device 100 includes a volatile memory device.

Thus, the memory controller 10 may communicate a clock signal CLK, a command CMD, an address ADDR signal, etc. to the memory device 100. Further, the memory controller 10 may provide data DQ to the memory device 100 and/or receive data DQ from the memory device 100.

In some embodiments, the memory device 100 may include a memory cell array 200 for storing the data DQ, a control logic circuit 110 and a data input/output (I/O) buffer 195.

Figure 2:
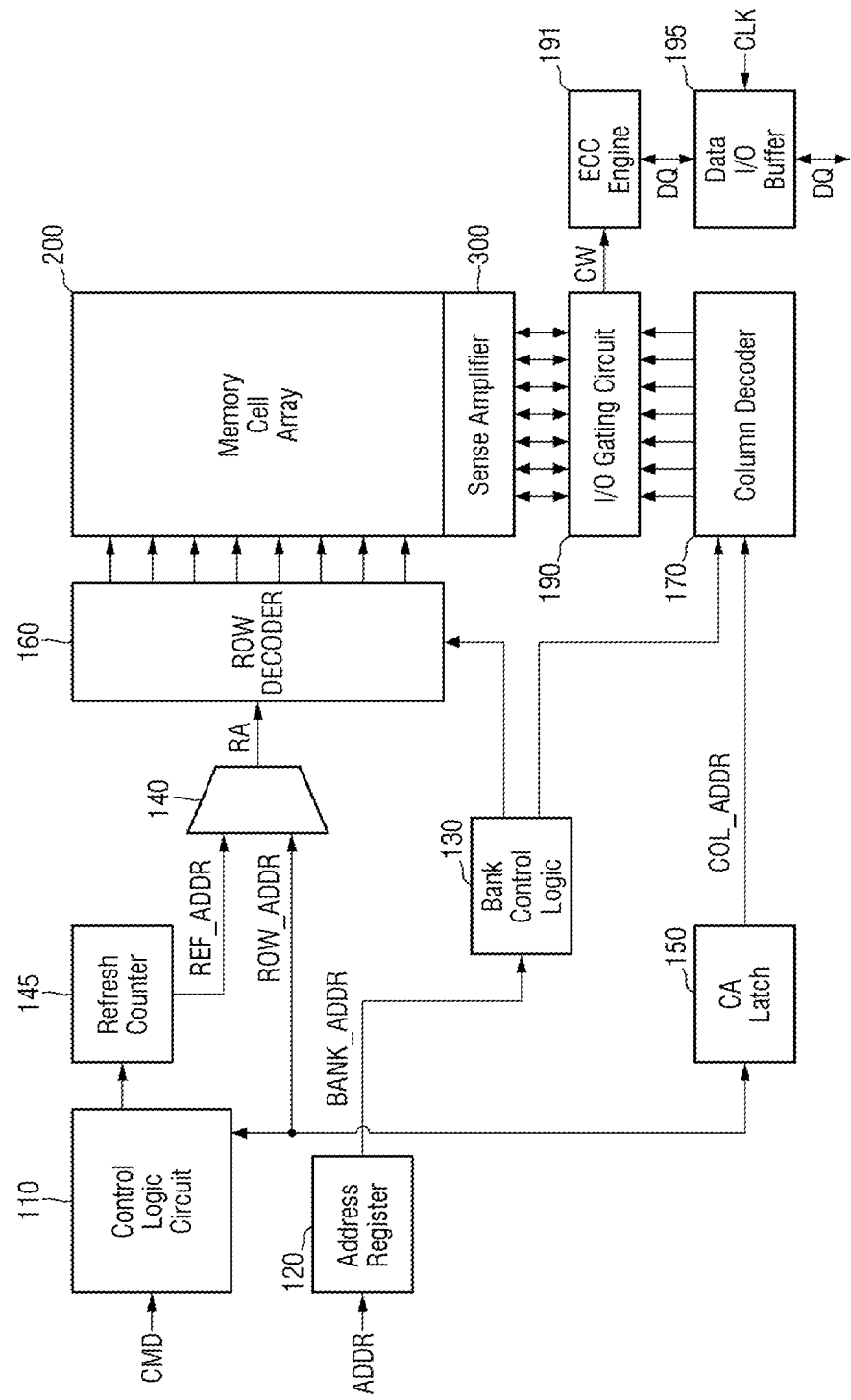
FIG. 2 is a block diagram further illustrating a memory device of FIG. 1.

FIG. 2 is a block diagram further illustrating in one example the memory device 100 of FIG. 1.

Referring to FIG. 2, the memory device 100 may include a control logic circuit 110, an address register 120, a bank control logic circuit 130, a row address multiplexer 140, a refresh counter 145, a column address latch 150, a row decoder 160, a column decoder 170, a memory cell array 200, a sense amplifier 300, an I/O gating circuit 190, an ECC engine 191, and a data I/O buffer 195.

The memory cell array 200 may be generally disposed between the row decoder 160 and the column decoder, and may include a plurality of bank memory arrays. The row decoder 160 may be connected to the plurality of bank memory arrays. The column decoder 170 may be connected to the plurality of bank memory arrays. The sense amplifier 300 may be connected to the plurality of bank memory arrays, respectively. The memory cell array 200 may include a plurality of word lines, a plurality of bit lines, and a plurality of memory cells formed at intersection points of the word lines and the bit lines.

The address register 120 may be supplied with an address ADDR from the memory controller 10. The address ADDR may include a bank address BANK_ADDR, a row address ROW_ADDR, and a column address COL_ADDR. The address register 120 may provide the bank address BANK_ADDR to the bank control logic circuit 130. The address register 120 may provide the row address ROW_ADDR to the row address multiplexer 140. The address register 120 may provide the column address COL_ADDR to the column address latch 150.

The bank control logic circuit 130 may generate a bank control signal in response to the bank address BANK_ADDR. The bank row decoder 160 may be activated in response to the bank control signal. The column decoder 170 may be activated in response to the bank control signal corresponding to the bank address BANK_ADDR.

The row address multiplexer 140 may receive the row address ROW_ADDR from the address register 120, and may receive a refresh row address REF_ADDR from the refresh counter 145. The row address multiplexer 140 may select one of the row address ROW_ADDR or the refresh row address REF_ADDR and output the selected one to a row address RA. The row address RA may be transferred to the row decoder 160.

The refresh counter 145 may sequentially output the refresh row addresses REF_ADDR under the control of the control logic circuit 110.

The row decoder 160 activated by the bank control logic circuit 130 may decode the row address RA output from the row address multiplexer 140 to activate the word line corresponding to the row address RA. For example, the row decoder 160 may apply a word line driving voltage to the word line corresponding to the row address RA.

The column address latch 150 may receive the column address COL_ADDR from the address register 120, and may temporarily store the received column address COL_ADDR. The column address latch 150 may gradually increase the column address COL_ADDR received in a burst mode. The column address latch 150 may provide the temporarily stored column address COL_ADDR or the gradually increased column address COL_ADDR to the column decoder 170.

The column decoder 170 activated by the bank control logic circuit 130 may activate the sense amplifier 300 corresponding to the bank address BANK_ADDR and the column address COL_ADDR through the corresponding I/O gating circuit 190.

The I/O gating circuit 190 may include a circuit for gating I/O data, an input data mask logic, read data latches for storing data output from the memory cell array 200, and write drivers for writing data in the memory cell array 200.

A codeword CW read from the bank memory array of the memory cell array 200 may be sensed by the sense amplifier 300 corresponding to the bank memory array. The codeword CW may also be stored in the read data latch. The codeword CW stored in the read data latch may be ECC-decoded by the ECC engine 191, and the data DQ for which ECC decoding is performed may be provided to the memory controller 10 through the data I/O buffer 195.

The data I/O buffer 195 may provide the data DQ to the ECC engine 191 based on the clock signal CLK in the write operation. The data I/O buffer 195 may provide the data DQ provided from the ECC engine 191 to the memory controller 10 based on the clock signal CLK in the read operation.

The memory cell array 200 may be connected to the sense amplifier 300, and the row decoder 160 and the column decoder 170 may be connected to the memory cell array 200 and the sense amplifier 300. Here, the plurality of bit lines included in the memory cell array 200 may be connected to the sense amplifier 300 in an open bit line structure. This will be described in more detail.

Figure 3:
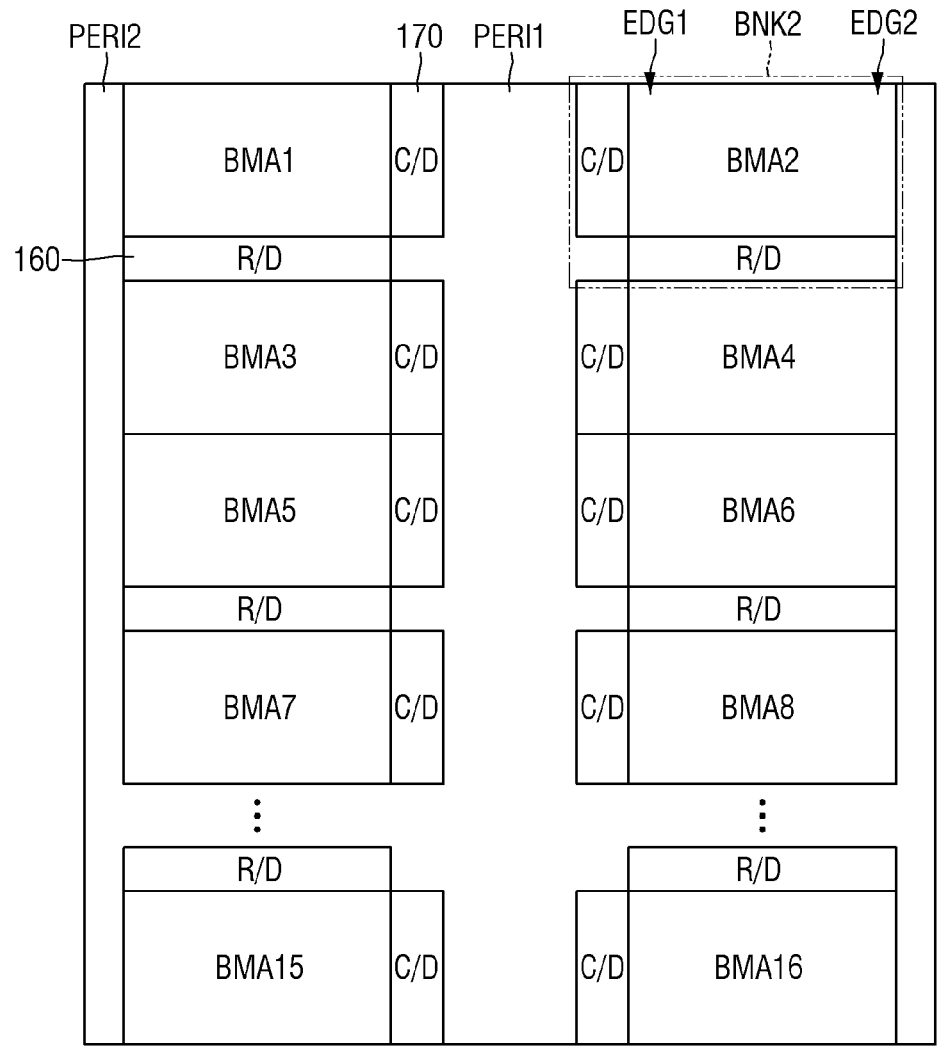
FIG. 3 is a plan view illustrating a memory device according to some embodiments.

FIG. 3 is a plan (or top-down) view illustrating a memory device according to some embodiments.

Referring to FIG. 3, the memory device 100 may include a plurality of bank memory arrays BMA1 to BMA16, a row decoder 160, a column decoder 170, a first peripheral circuit region PERI1, and a second peripheral circuit region PERI2.

In some embodiments, the memory device 100 may be disposed in a horizontal plane defined by a first horizontal direction (first direction X) and a second horizontal direction (second direction Y) intersecting the first direction X. In some embodiments, the memory device 100 may have a substantially rectangular shape.

As one example, the memory device 100 may include sixteen (16) bank memory arrays BMA1 to BMA16. The 16 bank memory arrays BMA1 to BMA16 may process data of 1 Gb, but the embodiments of the present disclosure are not limited thereto. The memory device 100 may include a different number of bank memory arrays BMA1 to BMA16 in addition to the 16 bank memory arrays. The bank memory arrays BMA1 to BMA16 may be arranged regularly. For example, the first, third, fifth, seventh, ninth, eleventh, thirteenth and fifteenth bank memory arrays BMA1, BMA3, BMA5, BMA7, BMA9, BMA11, BMA13 and BMA15 may be sequentially arranged along an opposite direction of the second direction Y, and the second, fourth, sixth, eighth, tenth, twelfth, fourteenth and sixteenth bank memory arrays BMA2, BMA4, BMA6, BMA8, BMA10, BMA12, BMA14 and BMA16 may be sequentially arranged along the opposite direction of the second direction Y. In addition, the second, fourth, sixth, eighth, tenth, twelfth, fourteenth and sixteenth bank memory arrays BMA2, BMA4, BMA6, BMA8, BMA10, BMA12, BMA14 and BMA16 may be spaced apart from the first, third, fifth, seventh, ninth, eleventh, thirteenth and fifteenth bank memory arrays BMA1, BMA3, BMA5, BMA7, BMA9, BMA11, BMA13 and BMA15 in the first direction X.

The row decoder 160 may extend in the first direction X, and may be disposed among the plurality of bank memory arrays BMA1 to BMA16. For example, the row decoder 160 may be disposed between the first bank memory array BMA1 and the third bank memory array BMA3. The column decoder 170 may extend in the second direction Y, and may be disposed on one side of the plurality of bank memory arrays BMA1 to BMA16. For example, the column decoder 170 may be disposed in the first direction X from the first bank memory array BMA1. Also, the row decoder 160 may cross the column decoder 170. In addition, the plurality of bank memory arrays BMA1 to BMA16 may be surrounded by the row decoder 160 and the column decoder 170. The plurality of bank memory arrays BMA1 to BMA16 may be defined by the row decoder 160 and the column decoder 170.

The first and second peripheral circuit regions PERI1 and PERI2 may be disposed in a portion of the memory device 100 except for the plurality of bank memory arrays BMA1 to BMA16, the row decoder 160 and the column decoder 170. The first and second peripheral circuit regions PERI1 and PERI2 may include the control logic circuit 110, the address register 120, the bank control logic circuit 130, the row address multiplexer 140, the refresh counter 145, the column address latch 150, the I/O gating circuit 190, the ECC engine 191 and the data I/O buffer 195 of FIG. 2.

The first peripheral circuit region PERI1 may be disposed among the plurality of bank memory arrays BMA1 to BMA16. The second peripheral circuit region PERI2 may be disposed outside the plurality of bank memory arrays BMA1 to BMA16. For example, the second peripheral circuit region PERI2 may be disposed in a direction opposite to the first direction X from the first, third, fifth, seventh, ninth, eleventh, thirteenth and fifteenth bank memory arrays BMA1, BMA3, BMA5, BMA7, BMA9, BMA11, BMA13 and BMA15, and may be disposed in the first direction X from the second, fourth, sixth, eighth, tenth, twelfth, fourteenth and sixteenth bank memory arrays BMA2, BMA4, BMA6, BMA8, BMA10, BMA12, BMA14 and BMA16.

One of the bank memory arrays BMA1 to BMA16 may include a portion of the memory cell array 200 and the sense amplifier 300, but the embodiments of the present disclosure are not limited thereto. One of the bank memory arrays BMA1 to BMA16 may include a first edge region EDG1 and a second edge region EDG2. For example, the second bank memory array BNK2 may include a first edge region EDG1 in a direction opposite to the first direction X and a second edge region EDG2 in the first direction X.

The memory bank may be defined by one of the bank memory arrays BMA1 to BMA16, one row decoder 160 and one column decoder 170. For example, the second memory bank BNK2 may be defined by the second bank memory array BNK2, the row decoder 160, and the column decoder 170. In this case, the memory bank may correspond to a storage unit indicating one bank address.

Figure 4:
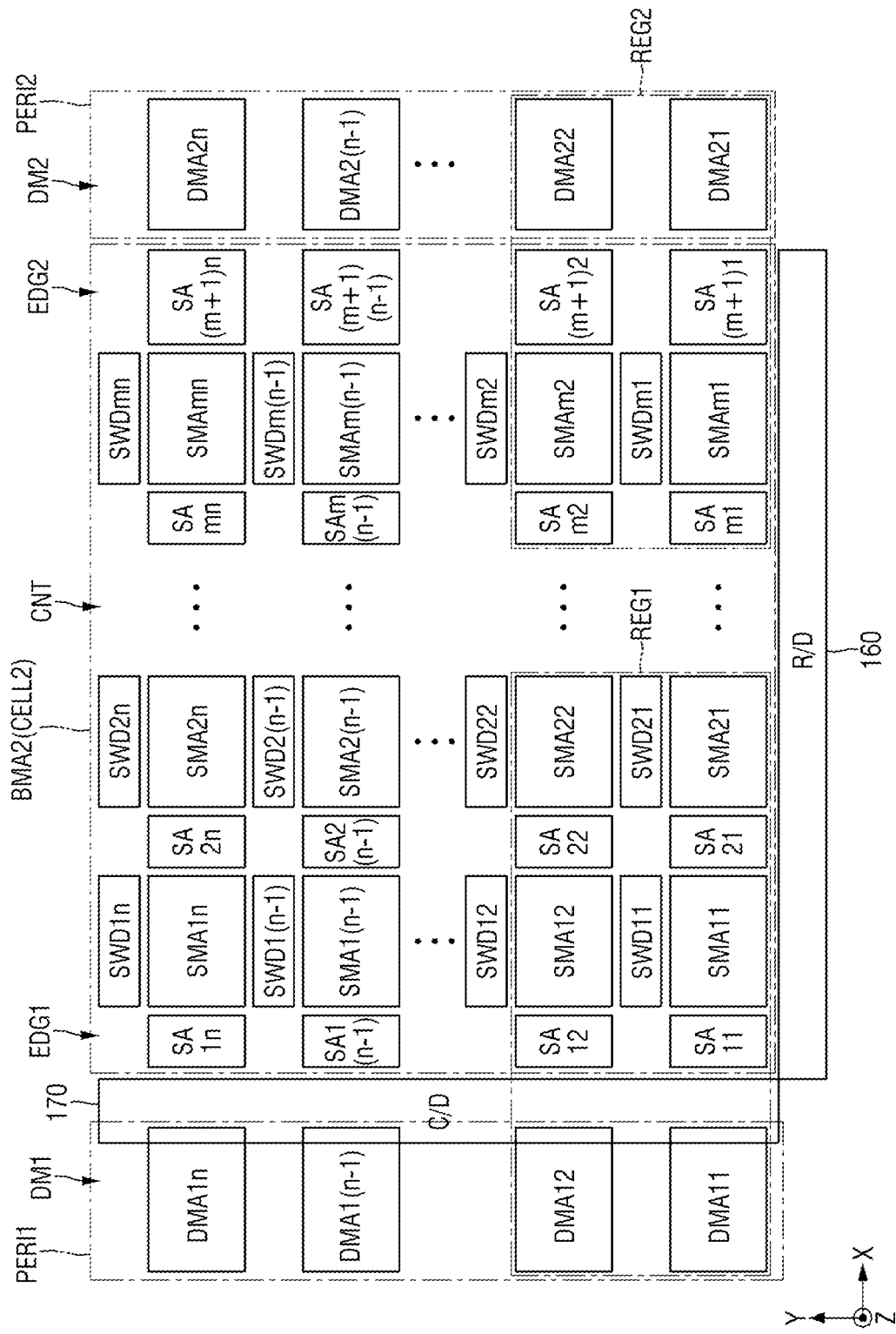
FIG. 4 is an enlarged view further illustrating a second memory bank of FIG. 3.

FIG. 4 is an enlarged view further illustrating, in part, the second memory bank BNK2 of FIG. 3.

Referring to FIG. 4, the second memory bank BNK2 may include a row decoder 160, a column decoder 170, and a second bank memory array BMA2 substantially surrounded by the row decoder 160 and the column decoder 170. The second bank memory array BMA2 may be referred to as a second cell region CELL2. The second bank memory array BMA2 may include a plurality of sense amplifiers, a plurality of mats, and a plurality of decoders. The plurality of sense amplifiers, the plurality of mats, and the plurality of decoders may be disposed in a region defined by the row decoder 160 and the column decoder 170.

The plurality of mats may include first to (n)th sub-memory arrays SMA11 to SMA1$n$, first to (n)th sub-memory arrays SMA21 to SMA2$n$, and first to (n)th sub-memory arrays SMAm1 to SMAmn. The first to (n)th sub-memory arrays SMA11 to SMA1$n$, the first to (n)th sub-memory arrays SMA21 to SMA2$n$, and the first to (n)th sub-memory arrays SMAm1 to SMAmn may be arranged along the first direction X. For example, the first to (n)th sub-memory arrays SMA21 to SMA2$n$ may be disposed in the first direction X from the first to (n)th sub-memory arrays SMA11 to SMA1$n$, and the first to (n)th sub-memory arrays SMAm1 to SMAmn may be disposed in the first direction X from the first to (n)th sub-memory arrays SMA21 to SMA2$n$.

The first to (n)th sub-memory arrays SMA11 to SMA1*n* may be arranged along the second direction Y. For example, the second sub-memory array SMA12 may be disposed in the second direction Y from the first sub-memory array SMA11, and the (n)th sub-memory array SMA1*n* may be disposed in the second direction Y from the (n−1) th sub-memory array SMA1 (n−1). In this case, the first to (n)th sub-memory arrays SMA11 to SMA1*n* may be disposed in the first edge region EDG1.

The first to (n)th sub-memory arrays SMA21 to SMA2*n* may be arranged along the second direction Y. For example, the second sub-memory array SMA22 may be disposed in the second direction Y from the first sub-memory array SMA21, and the (n)th sub-memory array SMA2*n* may be disposed in the second direction Y from the (n−1) th sub-memory array SMA2 (n−1). In this case, the first to (n)th sub-memory arrays SMA21 to SMA2*n* may be disposed in a center region CNT. The center region CNT may correspond to a region between the first edge region EDG1 and the second edge region EDG2. For example, the center region CNT may correspond to a portion except for the first edge region EDG1 and the second edge region EDG2 in the second bank memory array BMA2.

The first to (n)th sub-memory arrays SMAm1 to SMAmn may be arranged along the second direction Y. For example, the second sub-memory array SMAm2 may be disposed in the second direction Y from the first sub-memory array SMAm1, and the (n)th sub-memory array SMAmn may be disposed in the second direction Y from the (n−1) th sub-memory array SMAm (n−1). In this case, the first to (n)th sub-memory arrays SMAm1 to SMAmn may be disposed in the second edge region EDG2.

The plurality of sense amplifiers may include first to (n)th sub-sense amplifiers SA11 to SA1*n*, first to (n)th sub-sense amplifiers SA21 to SA2*n*, first to (n)th sub-sense amplifiers SAm1 to SAmn, and first to (n)th sub-sense amplifiers SA(m+1)1 to SA(m+1)n. The plurality of sense amplifiers may be disposed among the plurality of mats.

The sense amplifier may read or write (hereafter, "read/write") data by using a bit line and a complementary bit line, which are included in the mat. The sense amplifier and the decoder may be driven by the row decoder 160 and the column decoder 170.

The first to (n)th sub-sense amplifiers SA11 to SA1*n* may be disposed between the column decoder 170 and the first to (n)th sub-memory arrays SMA11 to SMA1*n*. In this case, each of the first to (n)th sub-sense amplifiers SA11 to SA1*n* may be connected to each of the first to (n)th sub-memory arrays SMA11 to SMA1*n*. The first to (n)th sub-sense amplifiers SA11 to SA1*n* may be disposed in the first edge region EDG1.

The first to (n)th sub-sense amplifiers SA21 to SA2*n* may be disposed between the first to (n)th sub-memory arrays SMA11 to SMA1*n* and the first to (n)th sub-memory arrays SMA21 to SMA2*n*. The first to (n)th sub-sense amplifiers SA21 to SA2*n* may be connected to the first to (n)th sub-memory arrays SMA11 to SMA1*n* and the first to (n)th sub-memory arrays SMA21 to SMA2*n*. The first to (n)th sub-sense amplifiers SAm1 to SAmn may be disposed in a direction opposite to the first direction X from the first to (n)th sub-memory arrays SMAm1 to SMAmn. The first to (n)th sub-sense amplifiers SAm1 to SAmn may be connected to the first to (n)th sub-memory arrays SMAm1 to SMAmn. The first to (n)th sub-sense amplifiers SA21 to SA2*n* and the first to (n)th sub-sense amplifiers SAm1 to SAmn may be disposed in the center region CNT.

The first to (n)th sub-sense amplifiers SA(m+1)1 to SA(m+1)n may be disposed between the second peripheral circuit region PERI2 and the first to (n)th sub-memory arrays SMAm1 to SMAmn. In this case, each of the first to (n)th sub-sense amplifiers SA(m+1)1 to SA(m+1)n may be connected to each of the first to (n)th sub-memory arrays SMAm1 to SMAmn. The first to (n)th sub-sense amplifiers SA(m+1)1 to SA(m+1)n may be disposed in the second edge region EDG2.

The plurality of decoders may include first to (n)th decoders SWD11 to SWD1*n*, first to (n)th decoders SWD21 to SWD2*n*, and first to (n)th decoders SWDm1 to SWDmn. The first to (n)th decoders SWD11 to SWD1*n* may be connected to the first to (n)th sub-memory arrays SMA11 to SMA1*n*, the first to (n)th decoders SWD21 to SWD2*n* may be connected to the first to (n)th sub-memory arrays SMA21 to SMA2*n*, and the first to (n)th decoders SWDm1 to SWDmn may be connected to the first to (n)th sub-memory arrays SMAm1 to SMAmn. The plurality of decoders may drive each sub-memory array.

The first peripheral circuit region PERI1 may include a first dummy mat DM1. The first dummy mat DM1 may be disposed in a direction opposite to the first direction X from the second bank memory array BMA2, and may be disposed in a direction opposite to the first direction X from the column decoder 170. In some embodiments, the first dummy mat DM1 may be disposed to overlap the column decoder 170, but the embodiments are not limited thereto.

The first dummy mat DM1 may include first to (n)th dummy memory arrays DMA11 to DMA1*n*. The first to (n)th dummy memory arrays DMA11 to DMA1*n* may be arranged in the second direction Y. The first to (n)th dummy memory arrays DMA11 to DMA1*n* may be connected to the first to (n)th sub-sense amplifiers SA11 to SA1*n*, respectively. In this case, the first to (n)th dummy memory arrays DMA11 to DMA1*n* may be disposed in the first peripheral circuit region PERI1, and the first to (n)th sub-sense amplifiers SA11 to SA1*n* may be disposed in the second cell region CELL2.

The second peripheral circuit region PERI2 may include a second dummy mat DM2. The second dummy mat DM2 may be arranged in the first direction X from the second bank memory array BMA2.

The second dummy mat DM2 may include first to nth dummy memory arrays DMA21 to DMA2N. The first to (n)th dummy memory arrays DMA21 to DMA2*n* may be arranged in the second direction Y. The first to (n)th dummy memory arrays DMA21 to DMA2*n* may be connected to the first to (n)th sub-sense amplifiers SA(m+1)1 to SA(m+1) n, respectively. In this case, the first to (n)th dummy memory arrays DMA21 to DMA2*n* may be disposed in the second peripheral circuit region PERI2, and the first to (n)th sub-sense amplifiers SA(m+1)1 to SA(m+1)n may be disposed in the second cell region CELL2.

Figure 5:
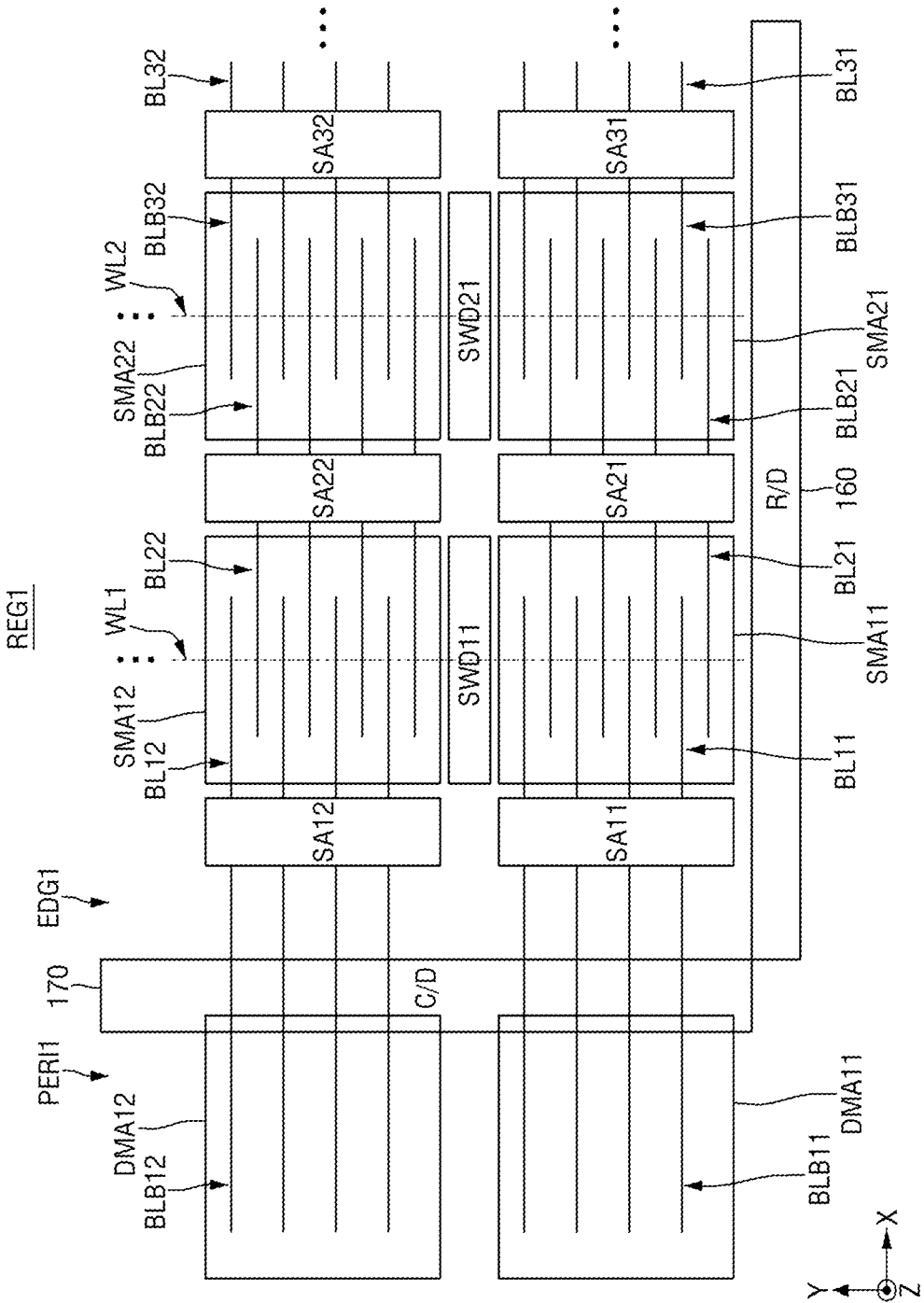
FIG. 5 is an enlarged view further illustrating the first region REG1 of FIG. 4.
Figure 6:
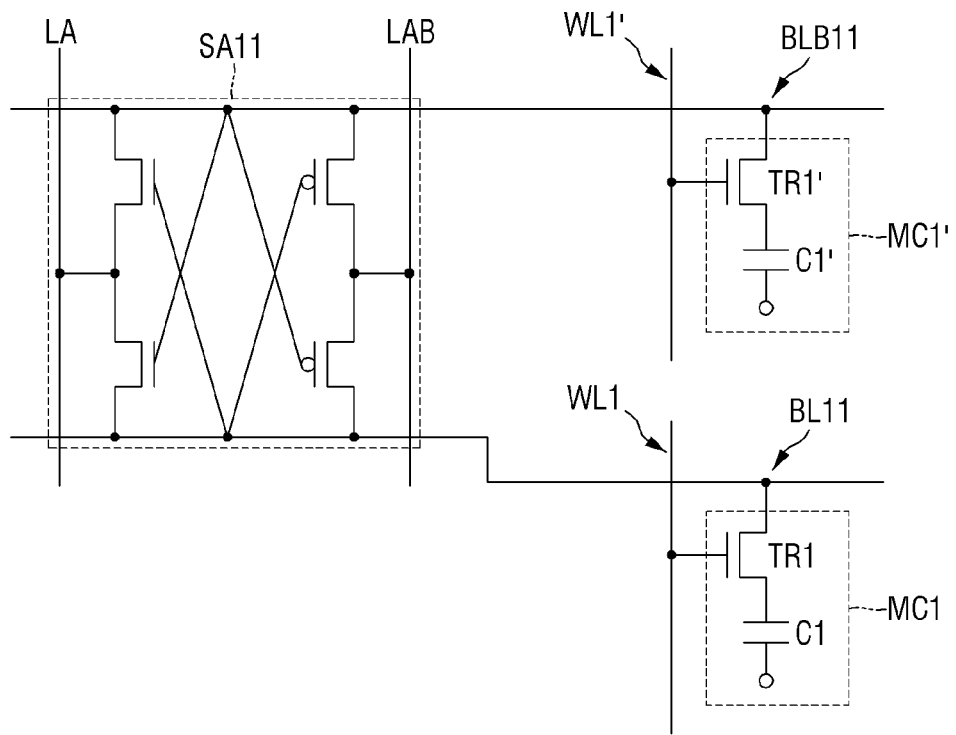
FIG. 6 is a circuit diagram illustrating a sense amplifier and a plurality of memory cells of FIG. 4.

FIG. 5 is an enlarged view further illustrating a first region REG1 indicated in FIG. 4, and FIG. 6 is a circuit diagram further illustrating in one example a sense amplifier SA11 connected to memory cells MC1 and MC1'.

Referring to FIG. 5, the second memory bank BNK2 corresponding to a first region REG1 may include a first sub-memory array SMA11, a second sub-memory array SMA12, a first sub-memory array SMA21, a second sub-memory array SMA22, a first sub-sense amplifier SA11, a second sub-sense amplifier SA12, a first sub-sense amplifier SA21, a second sub-sense amplifier SA22, a first sub-sense amplifier SA31, and a second sub-sense amplifier SA32. In addition, the first peripheral circuit region PERI1 may include a first dummy memory array DMA11 and a second dummy memory array DMA12.

The first sub-memory array SMA11 may include a first bit line BL11 and a first bit line BL21. The first bit line BL11 and the first bit line BL21 may extend in the first direction X. The first bit line BL11 may be connected to the first sub-sense amplifier SA11, and the first bit line BL21 may be connected to the first sub-sense amplifier SA21. The first word line WL1 may extend in the second direction Y, and may be connected to both of the first bit line BL11 and the first bit line BL21 of the first sub-memory array SMA11. In addition, the first word line WL1 may be connected to the first decoder SWD11.

The second sub-memory array SMA12 may include a second bit line BL12 and a second bit line BL22. The second bit line BL12 and the second bit line BL22 may extend in the first direction X. The second bit line BL12 may be connected to the second sub-sense amplifier SA12, and the second bit line BL22 may be connected to the second sub-sense amplifier SA22. The first word line WL1 may be connected to the second bit line BL12 and the second bit line BL22.

The first sub-memory array SMA21 may include a first complementary bit line BLB21 and a first complementary bit line BLB31. The first complementary bit line BLB21 and the first complementary bit line BLB31 may extend in the first direction X. The first complementary bit line BLB21 may be connected to the first sub-sense amplifier SA21, and the first complementary bit line BLB31 may be connected to the first sub-sense amplifier SA31. The second word line WL2 may extend in the second direction Y, and may be connected to both the first complementary bit line BLB21 and the first complementary bit line BLB31 of the first sub-memory array SMA21. Further, the second word line WL2 may be connected to the first decoder SWD21.

The second sub-memory array SMA22 may include a second complementary bit line BLB22 and a second complementary bit line BLB32. The second complementary bit line BLB22 and the second complementary bit line BLB32 may extend in the first direction X. The second complementary bit line BLB22 may be connected to the second sub-sense amplifier SA22, and the second complementary bit line BLB32 may be connected to the second sub-sense amplifier SA32. The second word line WL2 may be connected to the second complementary bit line BLB22 and the second complementary bit line BLB32.

The first dummy memory array DMA11 may include a first complementary bit line BLB11. The first complementary bit line BLB11 may extend in the first direction X. The first complementary bit line BLB11 may be connected to the first sub-sense amplifier SA11. That is, the first sub-sense amplifier SA11 may be connected to both the first bit line BL11 of the first sub-memory array SMA11 and the first complementary bit line BLB11 of the first dummy memory array DMA11. The first sub-sense amplifier SA11 may perform a read/write operation for the memory cell connected to the first bit line BL11 by using the first complementary bit line BLB11.

The second dummy memory array DMA12 may include a second complementary bit line BLB12. The second complementary bit line BLB12 may extend in the first direction X. The second complementary bit line BLB12 may be connected to the second sub-sense amplifier SA12. That is, the second sub-sense amplifier SA12 may be connected to both the second bit line BL12 of the second sub-memory array SMA12 and the second complementary bit line BLB12 of the second dummy memory array DMA12. The second sub-sense amplifier SA12 may perform a read/write operation for the memory cell connected to the second bit line BL12 by using the second complementary bit line BLB12.

In some embodiments, the first bit line BL11 and the second bit line BL12 may be disposed in the second cell region CELL2, and the first complementary bit line BLB11 and the second complementary bit line BLB12 may be disposed in the first peripheral circuit region PERI1. That is, the first complementary bit line BLB11 and the second complementary bit line BLB12 may not be disposed in the second cell region CELL2. The first complementary bit line BLB11 and the second complementary bit line BLB12 may be embedded in the first peripheral circuit region PERI1 rather than the second cell region CELL2. As the first and second dummy memory arrays DMA11 and DMA12 including the first complementary bit line BLB11 and the second complementary bit line BLB12 are not disposed in the second cell region CELL2, an area of the second cell region CELL2 of the memory device 100 may be reduced. That is, a memory device 100 having an increased cell density may be provided.

Referring to FIG. 6 (e.g., in the context of FIG. 4, the first sub-sense amplifier SA11 may be connected to the first bit line BL11 and the first complementary bit line BLB11.

The first memory cell MC1 may be connected to both the first bit line BL11 and the first word line WL1, and may be disposed at an intersection point between the first bit line BL11 and the first word line WL1. The first memory cell MC1 may include a first transistor TRI and a first capacitor C1. The first memory cell MC1 may perform a read/write operation by charging or discharging the first capacitor C1 by the first sub-sense amplifier SA11. A first memory cell MC1' may be connected to the first complementary bit line BLB11 and a first word line WL1', and may be disposed at an intersection point between the first complementary bit line BLB11 and the first word line WL1'. The first memory cell MC1' may include a first transistor TRI' and a first capacitor C1'. The first memory cell MC1' may correspond to a memory cell referred to in the case that the first sub-sense amplifier SA11 performs a read/write operation for the first memory cell MC1. That is, the first memory cell MC1' may correspond to a complementary relation with the first memory cell MC1. In addition, the first complementary bit line BLB11 may correspond to a complementary relation with the first bit line BL11.

In some embodiments, the first bit line BL11 may be included in the first sub-memory array SMA11, whereas the first complementary bit line BL11 may be included in the first dummy memory array DMA11. The first sub-sense amplifier SA11 may perform a read/write operation of data by using the first complementary bit line BLB11 and the first bit line BL11, which are disposed in their respective regions different from each other.

Figure 7:
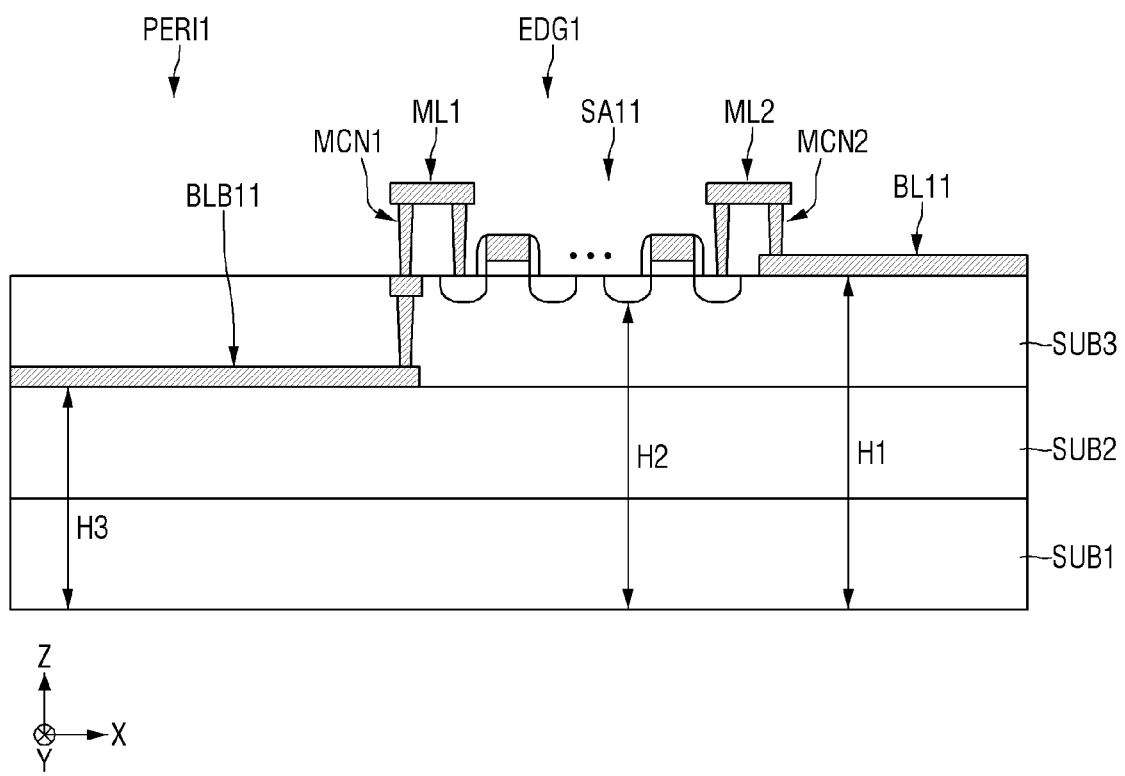
FIG. 7 is a cross-sectional view further illustrating the first region REG1 of FIG. 5.

FIG. 7 is a cross-sectional view further illustrating the first region REG1 indicated in FIG. 5.

Referring to FIG. 7, the memory device 100 may include a first substrate SUB1, a second substrate SUB2, a third substrate SUB3, a first sub-sense amplifier SA11, first and second metal lines ML1 and ML2, first and second metal contacts MCN1 and MCN2, a first bit line BL11, and a first complementary bit line BLB11. In this case, the first sub-sense amplifier SA11 and the first bit line BL11 may be disposed in the second cell region CELL2, and the first complementary bit line BLB11 may be disposed in the first peripheral circuit region PERI1. The second substrate SUB2 may be disposed on the first substrate SUB3, and the third substrate SUB3 may be disposed on the second substrate SUB3.

The first bit line BL11 may be connected to the first sub-sense amplifier SA11 through the second metal line ML2 and the second metal contact MCN2, and the first complementary bit line BLB11 may be connected to the first sub-sense amplifier SA11 through the first metal line ML1 and the first metal contact MCN1.

In this case, the first complementary bit line BLB11 may be disposed on the second substrate SUB2. The first sub-sense amplifier SA11 and the first bit line BL11 may be disposed on the third substrate SUB3. A height from a lower surface of the first substrate SUB1 to the first bit line BL11 may be a first height H1, a height from the lower surface of the first substrate SUB1 to the first sub-sense amplifier SA11 may be a second height H2, and a height from the lower surface of the first substrate SUB1 to the first complementary bit line BLB11 may be a third height H3. In this case, the third height H3 may be lower than the first height H1 and the second height H2. That is, the first complementary bit line BLB11 may be embedded in the first peripheral circuit region PERI1, and may be formed in a region deeper than the first bit line BL11 and the first sub-sense amplifier SA11. Therefore, the memory device 100 including a cell region having a reduced area may be provided.

Figure 8:
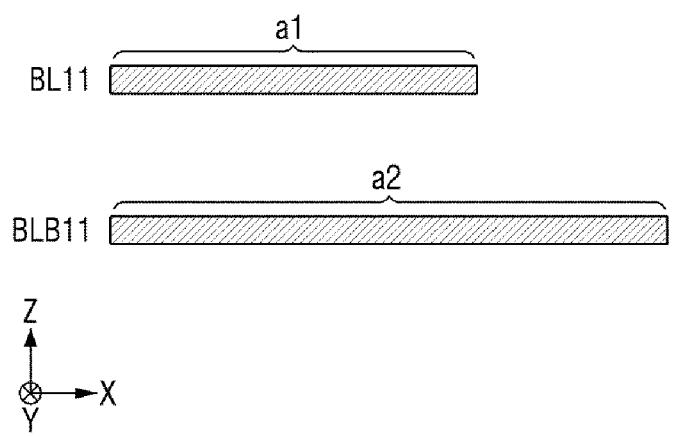

FIGS. 8 and 9 are respective conceptual diagrams illustrating a bit line and a complementary bit line according to some embodiments.

Referring to FIG. 8, the first bit line BL11 may have a first length a1 in the first direction X, and the first complementary bit line BLB11 may have a second length a2 in the first direction X.

A capacitance C of the first bit line BL11 or the first complementary bit line BLB11 may be determined using Equation 1 that follows:

$$C = \epsilon \cdot \frac{a}{t} \quad \text{Equation 1}$$

Here, the capacitance of the bit line is inversely proportional to a thickness of the bit line, and is proportional to a length of the bit line.

The second length a2 may be greater than the first length a1. In this way, the second length a2 of the first complementary bit line BLB11 is greater than the first length a1 of the first bit line BL11, so that the capacitance of the first complementary bit line BLB11 and the capacitance of the first bit line BL11 may be adjusted to be substantially equal to each other.

Referring to FIG. 9, the first bit line BL11 may have a first thickness t1, and the first complementary bit line BLB11 may have a second thickness t2. The first thickness t1 may be greater than the second thickness t2. In this way, the second thickness t2 of the first complementary bit line BLB11 may be smaller than the first thickness t1 of the first bit line BL11, so that the capacitance of the first complementary bit line BLB11 and the capacitance of the first bit line BL11 may be substantially equal to each other.

As described above, the capacitance of the first complementary bit line BLB11 may be adjusted, and the memory device 100 having more improved performance may be provided.

Figure 10:
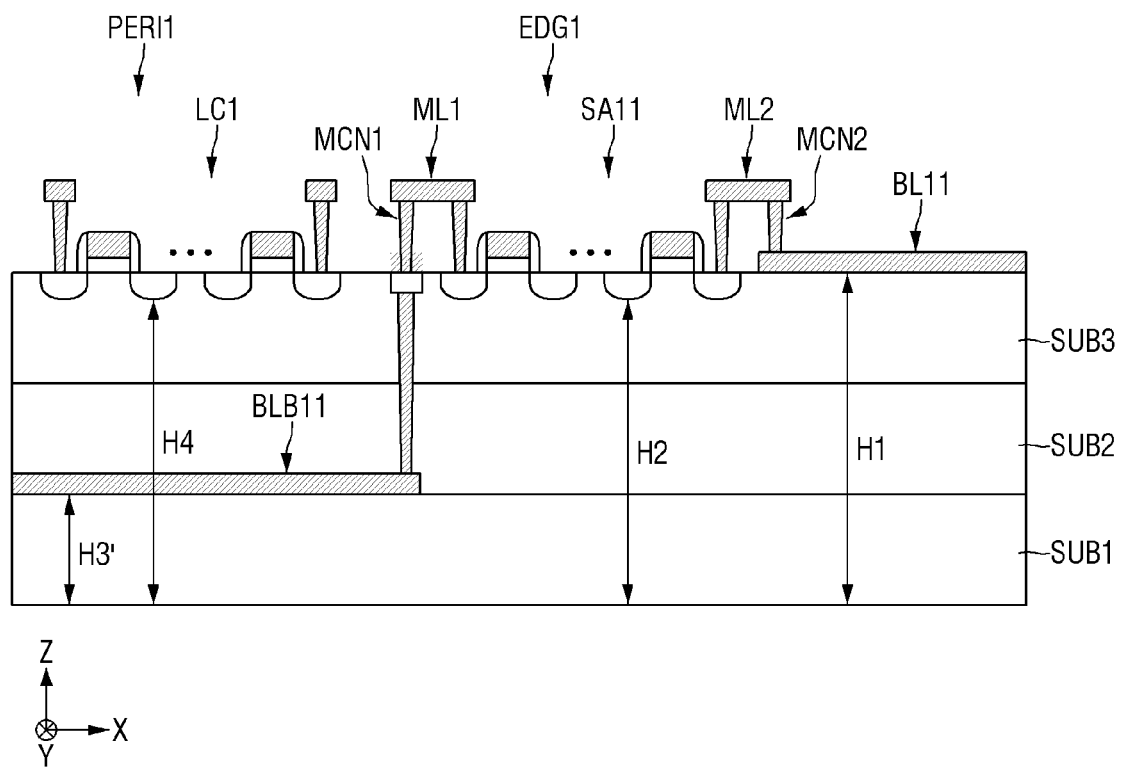
FIG. 10 is a cross-sectional view further illustrating the first region REG1 according to some embodiments.

FIG. 10 is a cross-sectional view further illustrating in one example the first edge region EDG1 of FIGS. 3 and 4 according to some embodiments.

Referring to FIG. 10, the memory device 100 may include a first logic circuit LC1. In this case, the first logic circuit LC1 may be disposed in the first peripheral circuit region PERI1. The first logic circuit LC1 may correspond to the control logic circuit 110, the address register 120, the bank control logic circuit 130, the row address multiplexer 140, the refresh counter 145, the column address latch 150, the row decoder 160, the column decoder 170, the I/O gating circuit 190, the ECC engine 191, and the data I/O buffer 195 of FIG. 2.

The first complementary bit line BLB11 may be disposed on the first substrate SUB1. The height from the lower surface of the first substrate SUB1 to the first complementary bit line BLB11 may correspond to a third height H3'. The first complementary bit line BLB11 may be connected to the first sub-sense amplifier SA11 through the first metal line ML11 and the first metal contact MCN1.

The first logic circuit LC1 may be spaced apart from the lower surface of the first substrate SUB1 as much as a fourth height H4. In this case, the fourth height H4 may be greater than the third height H3'. That is, both the first complementary bit line BLB11 and the first logic circuit LC1 may be disposed in the first peripheral circuit region PERI1. Also, the first complementary bit line BLB11 may be disposed below the first logic circuit LC1. As the first complementary bit line BLB11 is buried in the first peripheral circuit region PERI1 rather than the second cell region CELL2, the memory device 100 in which a cell area is reduced may be provided.

Figure 11:
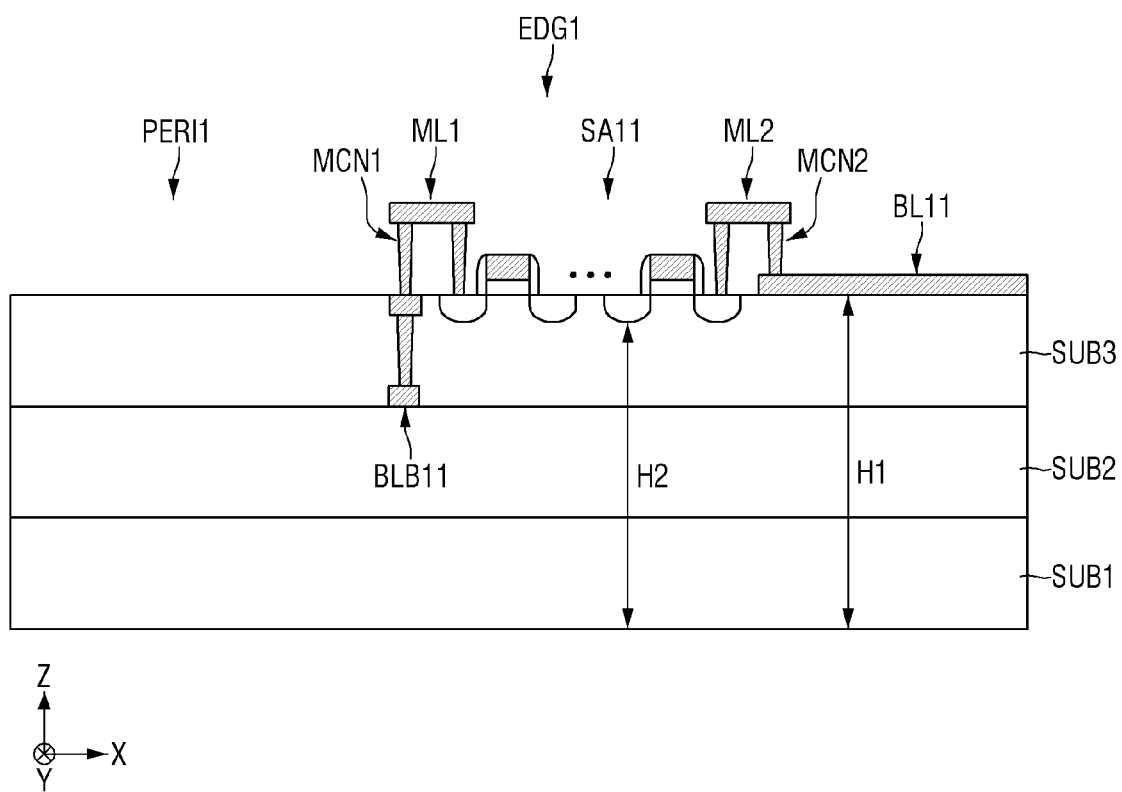
FIG. 11 is a cross-sectional view further illustrating the first region REG1 according to some embodiments.

FIG. 11 is a cross-sectional view further illustrating in another example the first region EDG1 of FIGS. 3 and 4 according to some embodiments.

Referring to FIG. 11, the first complementary bit line BLB11 may be disposed in the second substrate SUB2. The first complementary bit line BLB11 may extend in the second direction Y. That is, the first complementary bit line BLB11 may extend in a direction other than the first direction X, but the embodiments of the present disclosure are not limited thereto. The first complementary bit line BLB11 may extend in a direction other than the first direction X and the second direction Y.

Figure 12:
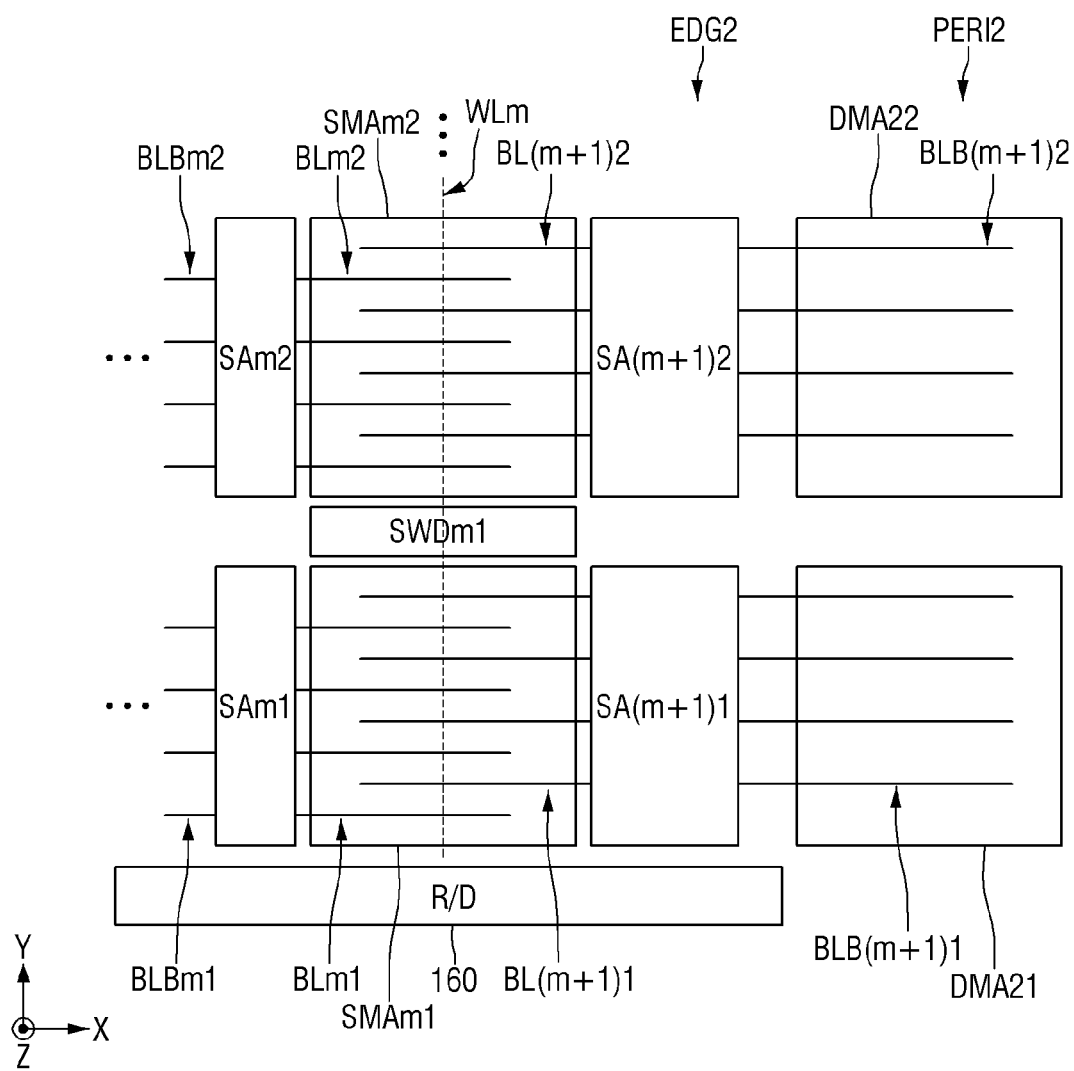
FIG. 12 is an enlarged view further illustrating the second region REG2 of FIG. 4.

FIG. 12 is an enlarged view further illustrating a second region REG2 indicated in FIG. 4.

Referring to FIG. 12, the second cell region CELL2 corresponding to the second region REG2 may include a first sub-sense amplifier SAm1, a first sub-sense amplifier SA(m+1)1, a second sub-sense amplifier SAm2, a second sub-sense amplifier SA(m+1)2, a first sub-memory array SMAm1, and a second sub-memory array SMAm2. The second peripheral circuit region PERI2 corresponding to the second region REG2 may include a first dummy memory array DMA21 and a second dummy memory array DMA22.

The first sub-memory array SMAm1 may include a first bit line BLm1 and a first bit line BL(m+1)1. The first bit line BLm1 may be connected to the first sub-sense amplifier SAm1, and the first bit line BL(m+1)1 may be connected to the first sub-sense amplifier SA(m+1)1. The second sub-memory array SMAm2 may include a second bit line BLm2 and a second bit line BL(m+1)2. The second bit line BLm2 may be connected to the second sub-sense amplifier SAm2, and the second bit line BL(m+1)2 may be connected to the second sub-sense amplifier SA(m+1)2. An m(th) word line WLm may be connected to the first sub-memory array SMAm1 and the second sub-memory array SMAm2.

The first dummy memory array DMA21 may be disposed to be spaced apart from the first sub-sense amplifier SA(m+1)1 in the first direction X. The first dummy memory array DMA21 may include a first complementary bit line BLB(m+1)1. The first dummy memory array DMA21 may be disposed in the second peripheral circuit region PERI2 not the second cell region CELL2. The first sub-sense amplifier SA(m+1)1 may perform a read/write operation for the memory cell connected to the first bit line BL(m+1)1 by using the first complementary bit line BLB(m+1)1.

The second dummy memory array DMA22 may be disposed to be spaced apart from the second sub-sense amplifier SA(m+1)2 in the first direction X. The second dummy memory array DMA22 may include a second complementary bit line BLB(m+1)2. The second dummy memory array DMA22 may be disposed in the second peripheral circuit region PERI2 not the second cell region CELL2. The second sub-sense amplifier SA(m+1)2 may perform a read/write operation for the memory cell connected to the second bit line BL(m+1)2 by using the second complementary bit line BLB(m+1)2.

As the first complementary bit line BLB(m+1)1 and the second complementary bit line BLB(m+1)2 are disposed in the second peripheral circuit region PERI2, an area of the second cell region CELL2 may be reduced, and the memory device 100 having an increased cell density may be provided.

Hereinafter, the memory device 100 according to some embodiments will be described in some additional detail with reference to FIGS. 13, 14 and 15.

Figure 13:
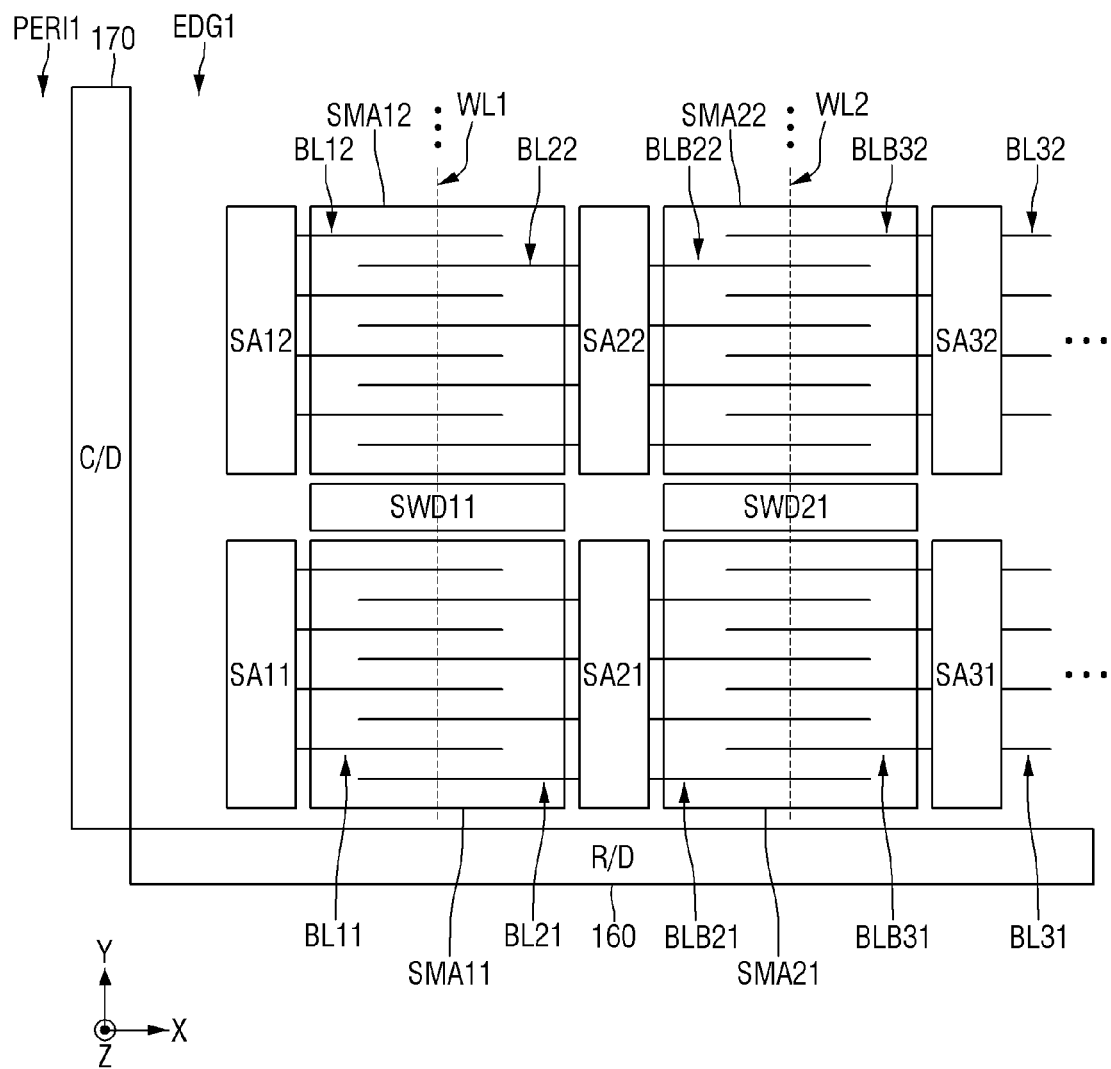
FIGS. 13 and 14 are plan views further illustrating the first region REG1 according to some embodiments.
Figure 14:
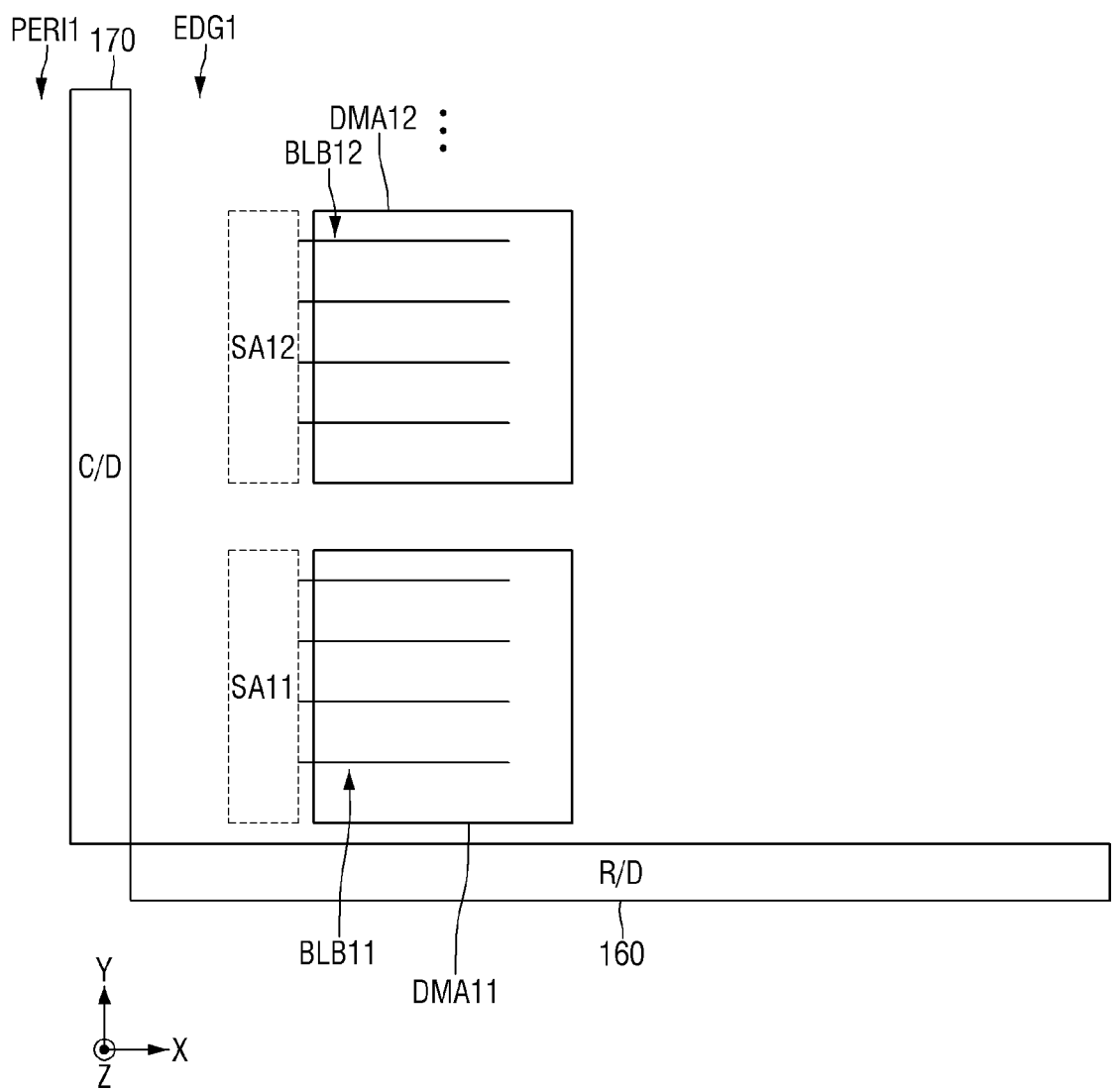
Figure 15:
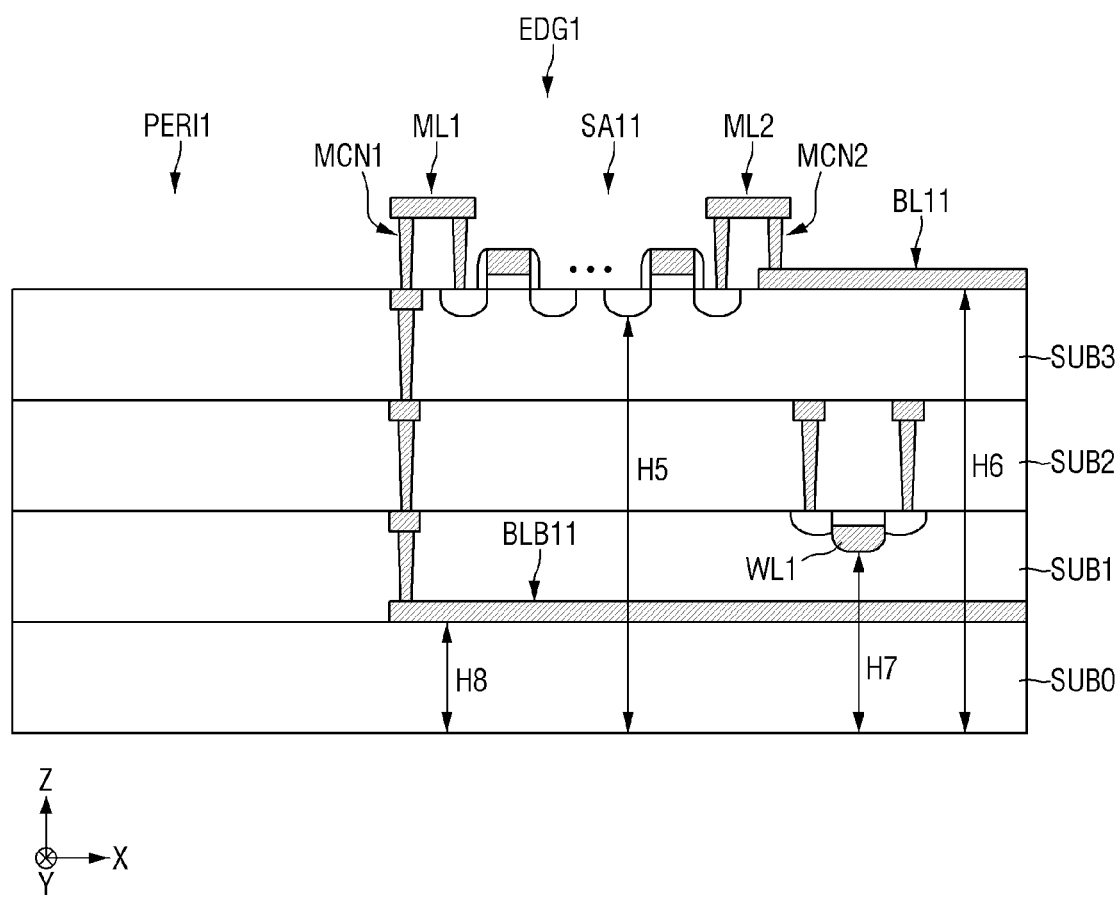
FIG. 15 is a cross-sectional view further illustrating the first region REG1 of FIGS. 13 and 14.

FIGS. 13 and 14 are respective plan views illustrating the first region REG1 according to some embodiments, and FIG. 15 is a cross-sectional view further illustrating the first region REG1 of FIGS. 13 and 14.

Referring to FIGS. 13 and 14, the second memory bank BNK2 corresponding to the first region REG1 may include a first sub-sense amplifier SA11, a second sub-sense amplifier SA12, a first sub-memory array SMA11, a second sub-memory array SMA12, a first dummy memory array DMA11, and a second dummy memory array DMA12.

The first sub-memory array SMA11 and the first dummy memory array DMA11 may be connected to the first sub-sense amplifier SA11. The first sub-memory array SMA11 may include a first bit line BL11, and the first dummy memory array DMA11 may include a first complementary bit line BLB11. The first word line WL1 may be connected to the first bit line BL11, but may not be connected to the first complementary bit line BLB11. The first complementary bit line BLB11 may be disposed below the first bit line BL11. The first sub-memory array SMA11 may overlap the first dummy memory array DMA11, but the embodiments of the present disclosure are not limited thereto.

The second sub-memory array SMA12 and the second dummy memory array DMA12 may be connected to the second sub-sense amplifier SA12. The second sub-memory array SMA12 may include a second bit line BL12, and the second dummy memory array DMA12 may include a second complementary bit line BLB12. The first word line WL1 may be connected to the second bit line BL12, but may not be connected to the second complementary bit line BLB12. The second complementary bit line BLB12 may be disposed below the second bit line BL12. The second sub-memory array SMA12 may overlap the second dummy memory array DMA12, but the embodiments of the present disclosure are not limited thereto.

The first and second dummy memory arrays DMA11 and DMA12 may be disposed in the second cell region CELL2 or the second bank memory array BMA2, not the first peripheral circuit region PERI1. The first and second complementary bit lines BLB11 and BLB12 included in the first and second dummy memory arrays DMA11 and DMA12 may be disposed below the first and second bit lines BL11 and BL12, whereby the memory device 100 having an increased cell density may be provided.

In this case, the length of each of the first and second complementary bit lines BLB11 and BLB12 may be greater than that of each of the first and second bit lines BL 11 and BL 12, and the thickness of each of the first and second complementary bit lines BLB11 and BLB12 may be less than that of each of the first and second bit lines BL11 and BL12.

Referring to FIG. 15, the memory device 100 may include a substrate SUB0, a first substrate SUB1, a second substrate SUB2, a third substrate SUB3, a first sub-sense amplifier SA11, first and second metal lines ML1 and ML2, first and second metal contacts MCN1 and MCN2, a first bit line BL11, a first complementary bit line BLB11, a first word line WL1, and the like. The first sub-sense amplifier SA11, the first and second metal lines ML1 and ML2, the first and second metal contacts MCN1 and MCN2, the first bit line BL11, the first complementary bit line BLB11, and the first word line WL1 may be disposed in the second cell region CELL2, and may not be disposed in the first peripheral circuit region CELL1 and the second peripheral circuit region CELL2.

The first sub-sense amplifier SA11 may be disposed on the third substrate SUB3. A height from a lower surface of the substrate SUB0 to the first sub-sense amplifier SA11 may be a fifth height H5. The first bit line BL11 may be disposed on the third substrate SUB3. A height from the lower surface of the substrate SUB0 to the first bit line BL11 may be a sixth height H6. The first word line WL1 may be disposed in the first substrate SUB1. A height from the substrate SUB0 to the first word line WL1 may be a seventh height H7. The first complementary bit line BLB11 may be disposed on the substrate SUB0. A height from the lower surface of the substrate SUB0 to the first complementary bit line BLB11 may be an eighth height H8.

The eighth height H8 may be less than the fifth to seventh heights H5 to H7. That is, the first complementary bit line BLB11 may be formed in a region deeper than the first sub-sense amplifier SA11, the first bit line BL11, and the first word line WL1. The first complementary bit line BLB11 is not formed in the first peripheral circuit region PERI1 but formed in the second cell region CELL2, whereby the memory device 100 having an increased cell density may be provided.

Figure 16:
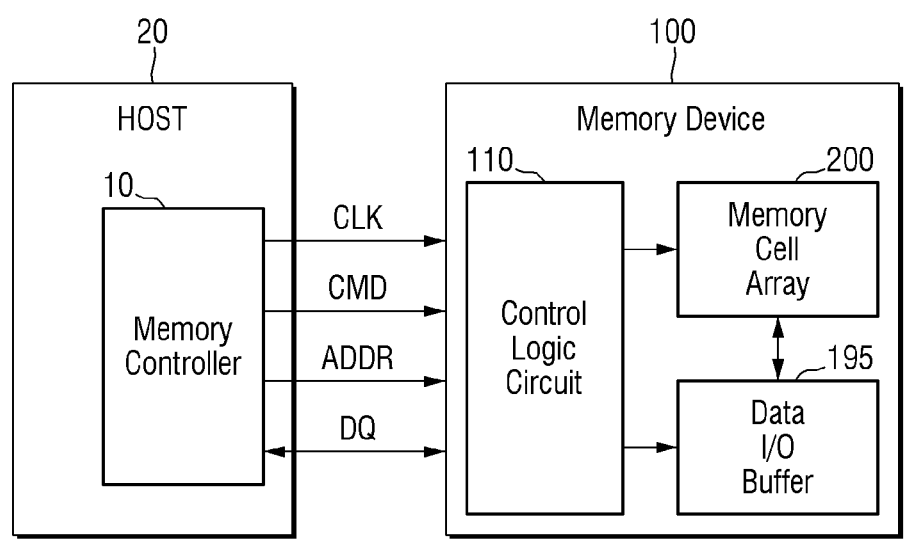
FIG. 16 is a block diagram illustrating a memory system according to some embodiments.

FIG. 16 is a block diagram illustrating a memory system according to some embodiments.

Referring to FIG. 16, the host device 20 may include a memory controller 10. That is, in the memory system of FIG. 1, the memory controller 10 was disposed external to the host device 20, whereas the memory controller 10 of FIG. 16 may be internal to the host device 20. The host device 20 may control the memory device 100 through the memory controller 10. In this case, the host device 20 may perform communication with the memory device 100 using one or more conventionally-understood and commercially-available technical standards, like those related to protocols associated with double data rate (DDR), low power double data rate (LPDDR), graphics data rate (GDDR), Wide I/O, High Bandwidth Memory (HBM), Hybrid Memory Cube (HMC), and/or Compute eXpress Link (CXL).

Figure 17:
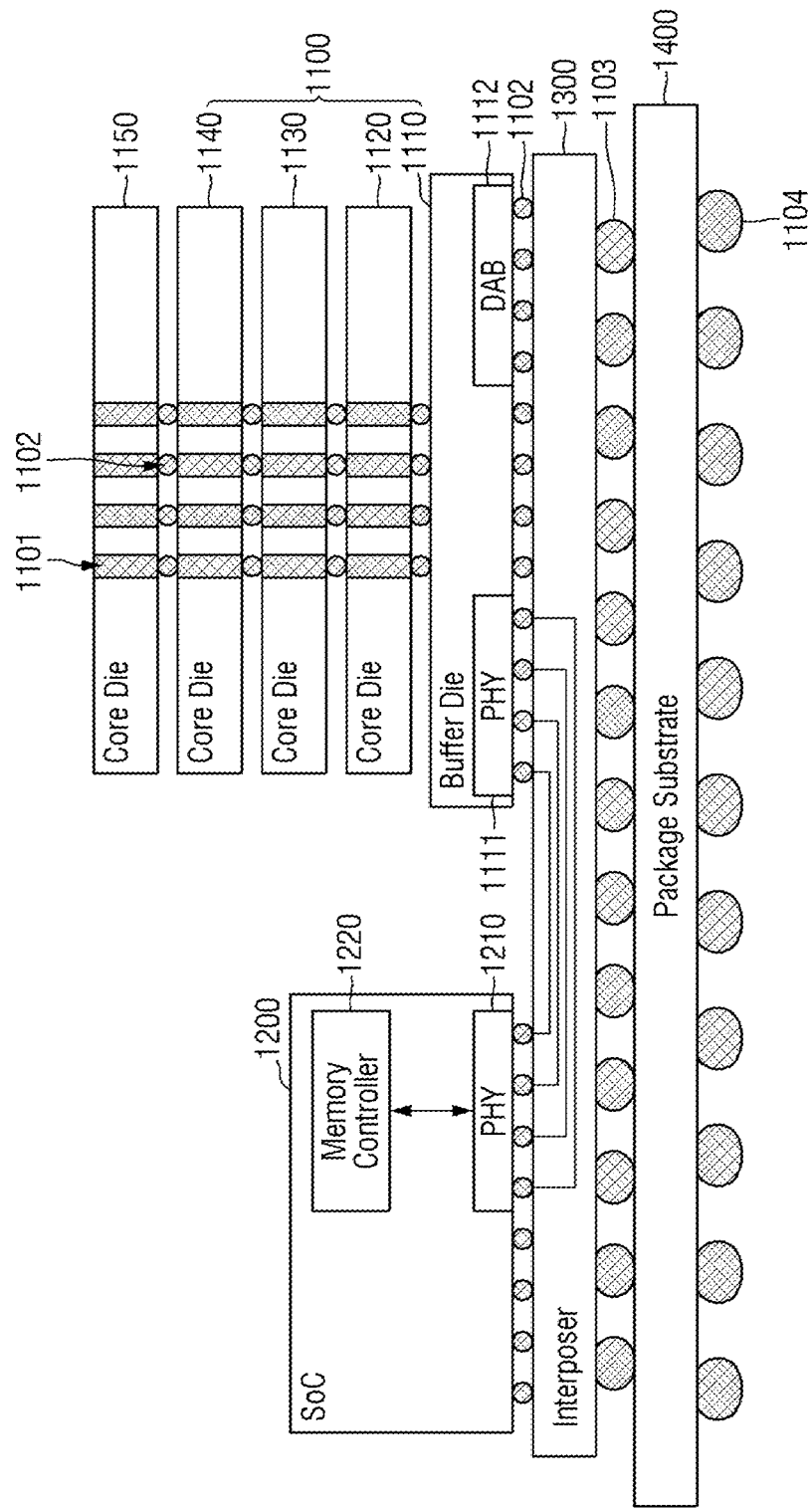
FIG. 17 is a cross-sectional diagram illustrating a semiconductor package according to some embodiments.

FIG. 17 is a cross-sectional diagram illustrating a semiconductor package according to some embodiments.

Referring to FIG. 17, a semiconductor package 1000 may include a stacked memory device 1100, a system-on-chip 1200, an interposer 1300, and a package substrate 1400. The stacked memory device 1100 may include a buffer die 1110 and core dies 1120 to 1150.

Each of the core dies 1120 to 1150 may include a memory cell array. The core dies 1120 to 1150 may include the memory device 100 described with reference to FIGS. 1 to 16. The buffer die 1110 may include a physical layer 1111 and a direct access region (DAB) 1112. The physical layer 1111 may be electrically connected to a physical layer 1210 of the system-on-chip 1200 through the interposer 1300. The stacked memory device 1100 may receive signals from the system-on-chip 1200 through the physical layer 1111, or may transmit the signals to the system-on-chip 1200.

The direct access region 1112 may provide an access path that may test the stacked memory device 1100 without passing through the system-on-chip 1200. The direct access region 1112 may include a conductive means (e.g., port or pin) that may directly perform communication with an external test device. A test signal and data received through the direct access region 1112 may be transmitted to the core dies 1120 to 1150 through TSVs. Data read from the core dies 1120 to 1150 to test the core dies 1120 to 1150 may be transmitted to the test device through the TSVs and the direct access region 1112. Therefore, a direct access test for the core dies 1120 to 1150 may be performed.

The buffer die 1110 and the core dies 1120 to 1150 may be electrically connected to one another through TSVs 1101 and bumps 1102. The buffer die 1110 may receive signals provided to each channel through the bumps 1102 allocated for each channel from the system-on-chip 1200. For example, the bumps 1102 may be micro-bumps.

The system-on-chip 1200 may execute applications supported by the semiconductor package 1000 by using the stacked memory device 1100. For example, the system-on-chip 1200 may include at least one processor of a central processing unit (CPU), an application processor (AP), a graphic processing unit (GPU), a neural processing unit (NPU), a tensor processing unit (TPU), a vision processing unit (VPU), an image signal processor (ISP), or a digital signal processor (DSP) to execute specialized computations.

The system-on-chip 1200 may include the physical layer 1210 and a memory controller 1220. The physical layer 1210 may include I/O circuits for transmitting and receiving signals to and from the physical layer 1111 of the stacked memory device 1100. The system-on-chip 1200 may provide various signals to the physical layer 1111 through the physical layer 1210. The signals provided to the physical layer 1111 may be transferred to the core dies 1120 to 1150 through the TSVs 1101 and interface circuits of the physical layer 1111.

The memory controller 1220 may control the overall operation of the stacked memory device 1100. The memory controller 1220 may transmit signals for controlling the stacked memory device 1100 to the stacked memory device 1100 through the physical layer 1210. The memory controller 1220 may correspond to the memory controller 10 of FIG. 1.

The interposer 1300 may connect the stacked memory device 1100 with the system-on-chip 1200. The interposer 1300 may connect the physical layer 1111 of the stacked memory device 1100 with the physical layer 1210 of the system-on-chip 1200, and may provide physical paths formed using conductive materials. Therefore, the stacked memory device 1100 and the system-on-chip 1200 may be stacked on the interposer 1300 to transmit and receive signals to and from each other.

Bumps 1103 may be attached to an upper portion of the package substrate 1400, and solder balls 1104 may be attached to a lower portion of the package substrate 1400. For example, the bumps 1103 may be flip-chip bumps. The interposer 1300 may be stacked on the package substrate 1400 through the bumps 1103. The semiconductor package 1000 may transmit and receive signals to and from other external packages or semiconductor devices through the solder balls 1104. For example, the package substrate 1400 may be a printed circuit board (PCB).

Figure 18:
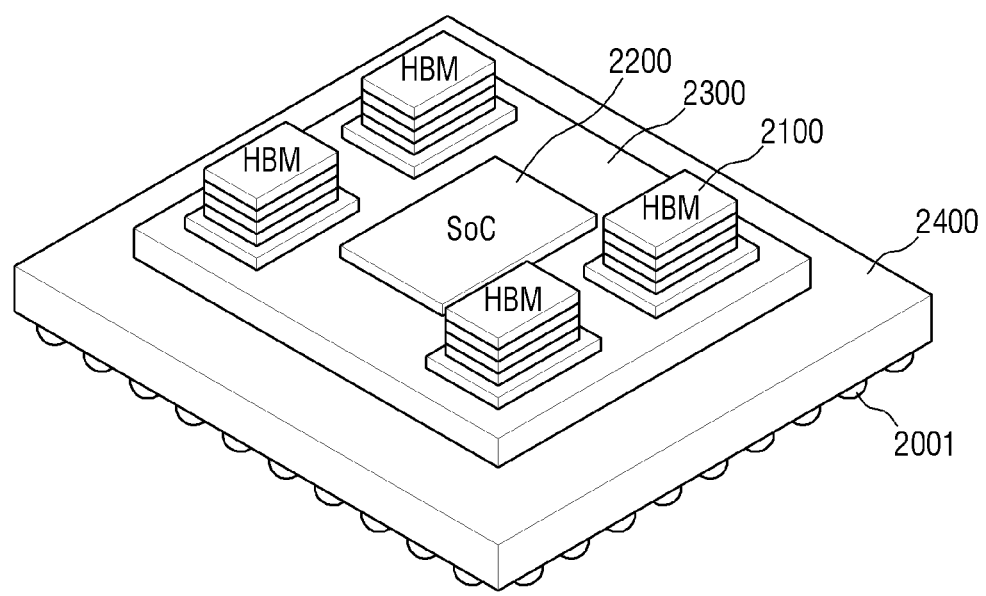
FIG. 18 is a perspective diagram illustrating one implementation example for a semiconductor package according to some embodiments.

FIG. 18 is a perspective diagram illustrating in one example a semiconductor package according to some embodiments.

Referring to FIG. 18, the semiconductor package 2000 may include a plurality of stacked memory devices 2100 and a system-on-chip 2200. The stacked memory devices 2100 and the system-on-chip 2200 may be stacked on the interposer 2300, and the interposer 2300 may be stacked on a package substrate 2400. The semiconductor package 2000 may transmit and receive signals to and from other external packages or semiconductor devices through solder balls 2001 attached to a lower portion of the package substrate 2400.

Each of the stacked memory devices 2100 may be implemented based on the HBM standard, but the present disclosure is not limited thereto. Each of the stacked memory devices 2100 may be implemented based on the GDDR, HMC, or Wide I/O standard. Each of the stacked memory devices 2100 may correspond to the stacked memory device 1100 of FIG. 18.

The system-on-chip 2200 may include at least one processor such as a CPU, an AP, a GPU and an NPU, and a plurality of memory controllers for controlling the plurality of stacked memory devices 2100. The system-on-chip 2200 may transmit and receive signals to and from a corresponding stacked memory device through the memory controller. The system-on-chip 2200 may correspond to the system-on-chip 1200 of FIG. 17.

Figure 19:
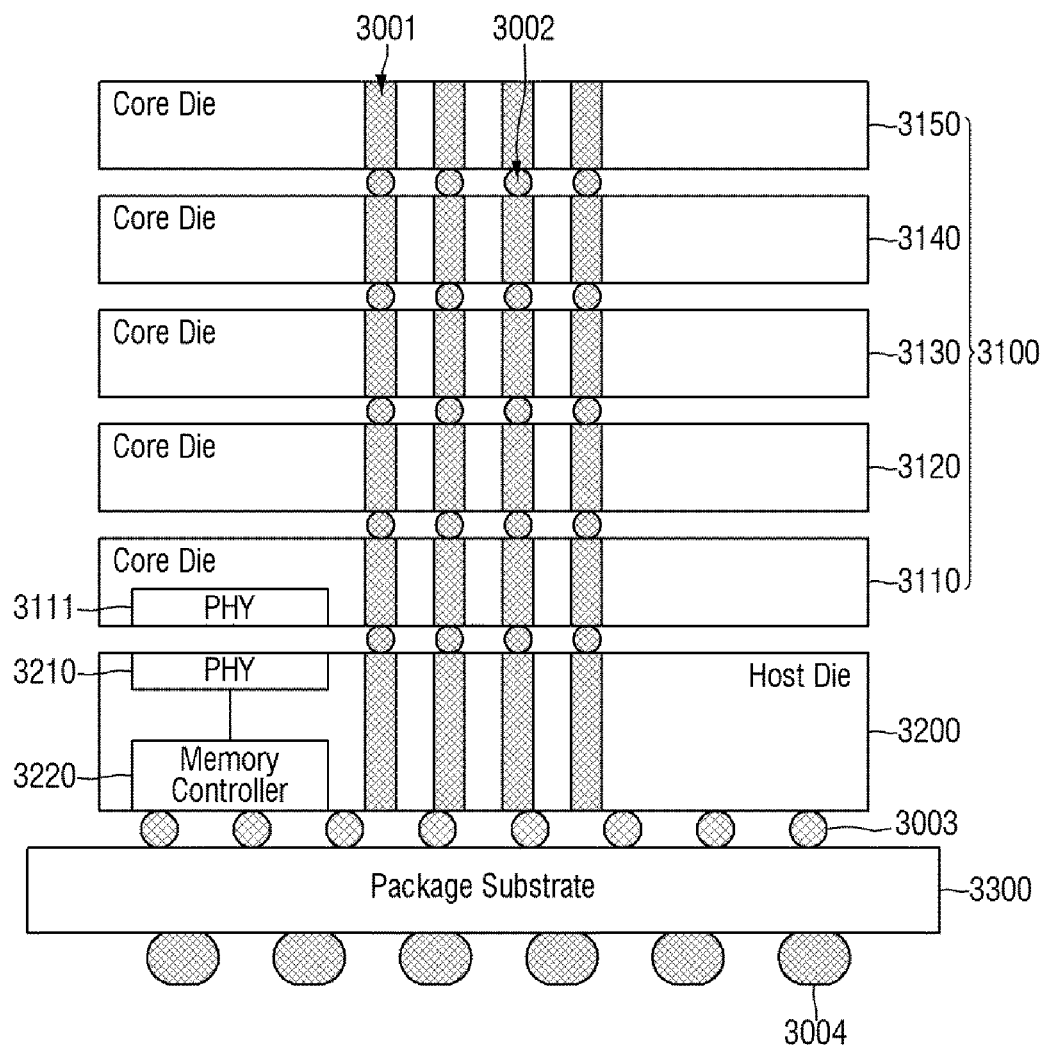
FIG. 19 is a cross-sectional diagram illustrating a semiconductor package according to some embodiments.

FIG. 19 is a cross-sectional diagram illustrating a semiconductor package according to some embodiments.

Referring to FIG. 19, the semiconductor package 3000 may include a stacked memory device 3100, a host die 3200, and a package substrate 3300. The stacked memory device 3100 may include a buffer die 3110 and core dies 3120 to 3150. The buffer die 3110 may include a physical layer 3111 for performing communication with the host die 3200, and each of the core dies 3120 to 3150 may include a memory cell array.

The host die 3200 may include a physical layer 3210 for performing communication with the stacked memory device 3100, and a memory controller 3220 for controlling the overall operation of the stacked memory device 3100. The host die 3200 may also include a processor for controlling the overall operation of the semiconductor package 3000 and executing an application supported by the semiconductor package 3000. For example, the host die 3200 may include at least one processor such as a CPU, an AP, a GPU and an NPU.

The stacked memory device 3100 may be disposed on the host die 3200 based on TSVs 3001 and vertically stacked on the host die 3200. Therefore, the buffer die 3110, the core dies 3120 to 3150 and the host die 3200 may be electrically connected to one another through the TSVs 3001 and bumps 3002 without an interposer. For example, the bumps 3002 may be micro-bumps.

Bumps 3003 may be attached to an upper portion of the package substrate 3300, and solder balls 3004 may be attached to a lower portion of the package substrate 3300. For example, the bumps 3003 may be flip-chip bumps. The host die 3200 may be stacked on the package substrate 3300 through the bumps 3003. The semiconductor package 3000 may transmit and receive signals to and from other external packages or semiconductor devices through the solder balls 3004.

Although the embodiments of the present disclosure have been described with reference to the accompanying drawings, it will be apparent to those skilled in the art that the present disclosure can be implemented in various forms without being limited to the above-described embodiments and can be embodied in other specific forms without departing from the technical spirit and essential characteristics. Thus, the above embodiments are to be considered in all respects as illustrative and not restrictive.

What is claimed is:

1. A volatile memory device comprising:
   a row decoder extending in a first direction;
   a column decoder extending in a second direction;
   a cell region between the row decoder and the column decoder and including a first sense amplifier and a first bit line connected to the first sense amplifier; and
   a first peripheral circuit region spaced apart from the cell region in the first direction and including a first complementary bit line connected to the first sense amplifier,
   wherein the first sense amplifier is configured to perform a read/write operation in relation to a first memory cell connected to the first bit line using the first complementary bit line, and
   wherein a length of the first complementary bit line is greater than a length of the first bit line.

2. The volatile memory device of claim 1, further comprising:
   a second peripheral circuit region spaced apart from the cell region in a direction opposite to the first direction,
   wherein the cell region further includes a second sense amplifier and a second bit line connected to the second sense amplifier, and
   the second peripheral circuit region includes a second complementary bit line connected to the second sense amplifier.

3. The volatile memory device of claim 2, wherein the first sense amplifier is disposed at an edge portion of the cell region in the first direction, and the second sense amplifier is disposed at an edge portion of the cell region in a direction opposite to the first direction.

4. The volatile memory device of claim 1, further comprising:
   a substrate formed below the cell region and the first peripheral circuit region,
   wherein a first height from the substrate to the first sense amplifier is greater than a second height from the substrate to the first complementary bit line.

5. The volatile memory device of claim 4, wherein a third height from the substrate to the first bit line is greater than the second height.

6. The volatile memory device of claim 4, wherein the first peripheral circuit region includes a logic circuit disposed above the first complementary bit line, and
   a third height from the substrate to the logic circuit is greater than the second height.

7. The volatile memory device of claim 1, wherein the first bit line and the first complementary bit line extend in the first direction.

8. The volatile memory device of claim 1, wherein the first bit line extends in the first direction, and the first complementary bit line extends in the second direction.

9. The volatile memory device of claim 1, wherein a thickness of the first complementary bit line is less than that of the first bit line.

10. A volatile memory device comprising:
    a row decoder extending in a first direction;
    a column decoder extending in a second direction; and
    a memory cell array between the row decoder and the column decoder,
    wherein the memory cell array includes:
      a substrate;
      a first sense amplifier on the substrate;
      a first bit line connected to the first sense amplifier; and
      a first complementary bit line connected to the first sense amplifier,
    wherein a first height from the substrate to the first sense amplifier is greater than a third height from the substrate to the first complementary bit line, and a second height from the substrate to the first bit line is greater than the third height.

11. The volatile memory device of claim 10, wherein the memory cell array further includes a word line connected to the first bit line, and
    a fourth height from the substrate to the word line is greater than the third height.

12. The volatile memory device of claim 11, wherein the word line is not connected to the first complementary bit line.

13. The volatile memory device of claim 10, wherein the first bit line and the first complementary bit line extend in the first direction, and
    the first bit line overlaps the first complementary bit line.

14. The volatile memory device of claim 10, further comprising:
    a peripheral circuit region spaced apart from the memory cell array,
    wherein the first bit line and the first complementary bit line are not disposed in the peripheral circuit region.

15. The volatile memory device of claim 10, wherein a length of the first complementary bit line is greater than that of the first bit line in the first direction.

16. The volatile memory device of claim 10, wherein a thickness of the first complementary bit line is less than that of the first bit line.

17. A volatile memory device comprising:
    a row decoder extending in a first direction;
    a column decoder extending in a second direction;
    a memory cell array between the row decoder and the column decoder; and
    a dummy mat disposed separated from the memory cell array in the first direction,
    wherein the memory cell array includes:
      a center region including a first sense amplifier, a first mat including a first bit line connected to the first sense amplifier, and a second mat including a first complementary bit line connected to the first sense amplifier; and
      a first edge region separated from the center region in the first direction and including a second sense amplifier and a second bit line connected to the second sense amplifier,
    wherein the dummy mat includes a second complementary bit line separated from the first edge region in the first direction and connected to the second sense amplifier without being disposed in the memory cell array.

18. The volatile memory device of claim 17, wherein the memory cell array does not overlap the dummy mat.

19. The volatile memory device of claim 17, wherein the second sense amplifier is configured to perform a read/write operation in relation to a memory cell connected to the second bit line using the second complementary bit line.

* * * * *